United States Patent [19]
Oowaki et al.

[11] Patent Number: 5,144,583
[45] Date of Patent: Sep. 1, 1992

[54] DYNAMIC SEMICONDUCTOR MEMORY DEVICE WITH TWISTED BIT-LINE STRUCTURE

[75] Inventors: Yukihito Oowaki, Yokohama; Kenji Tsuchida, Kawasaki; Daisaburo Takashima, Yokohama, all of Japan

[73] Assignee: Kabushiki Kaisha Toshiba, Kawasaki, Japan

[21] Appl. No.: 461,121

[22] Filed: Jan. 4, 1990

[30] Foreign Application Priority Data

Jan. 9, 1989 [JP] Japan .................................. 1-2452
Jan. 9, 1989 [JP] Japan .................................. 1-2453
Jan. 9, 1989 [JP] Japan .................................. 1-2454

[51] Int. Cl.$^5$ .............................................. G11C 11/00
[52] U.S. Cl. ..................................... 365/206; 365/149
[58] Field of Search ............... 365/206, 149, 190, 208, 365/69

[56] References Cited

U.S. PATENT DOCUMENTS 4,366,559 12/1982 Misaizu et al. ...................... 365/205

FOREIGN PATENT DOCUMENTS 0167281 1/1986 European Pat. Off. .
0293578 12/1988 European Pat. Off. .
60-254489 12/1985 Japan .
62-51096 3/1987 Japan .

OTHER PUBLICATIONS

IEEE Journal of Solid-State Circuits, vol. 24, No. 1, Feb. 1989, pp. 21-27.
ISSCC 88, Digest of Technical Papers, pp. 238-239, Tsutomu Yamashita et al., Feb., 1988.

Primary Examiner—Joseph A. Popek
Attorney, Agent, or Firm—Oblon, Spivak, McClelland, Maier & Neustadt

[57] ABSTRACT

A dynamic random-access memory has bit-line pairs, word lines intersecting with the bit-line pairs, and memory cells arranged at the intersections of the bit-line pairs and the word lines, and sense amplifiers provided for the bit-line pairs, respectively. One of every two neighboring bit-line pairs is twisted at one portion, thus forming a twisted crossing section. The twisted crossing section is made of the parts of the gate electrodes of the transistors incorporated in the sense amplifier connected to the twisted bit-line pair. The bit-line pairs is twisted at a portion substantially middle with respect to the direction in which it extends, and the sensr amplifier associated with this bit-line pair is located at the twisted portion thereof.

15 Claims, 30 Drawing Sheets

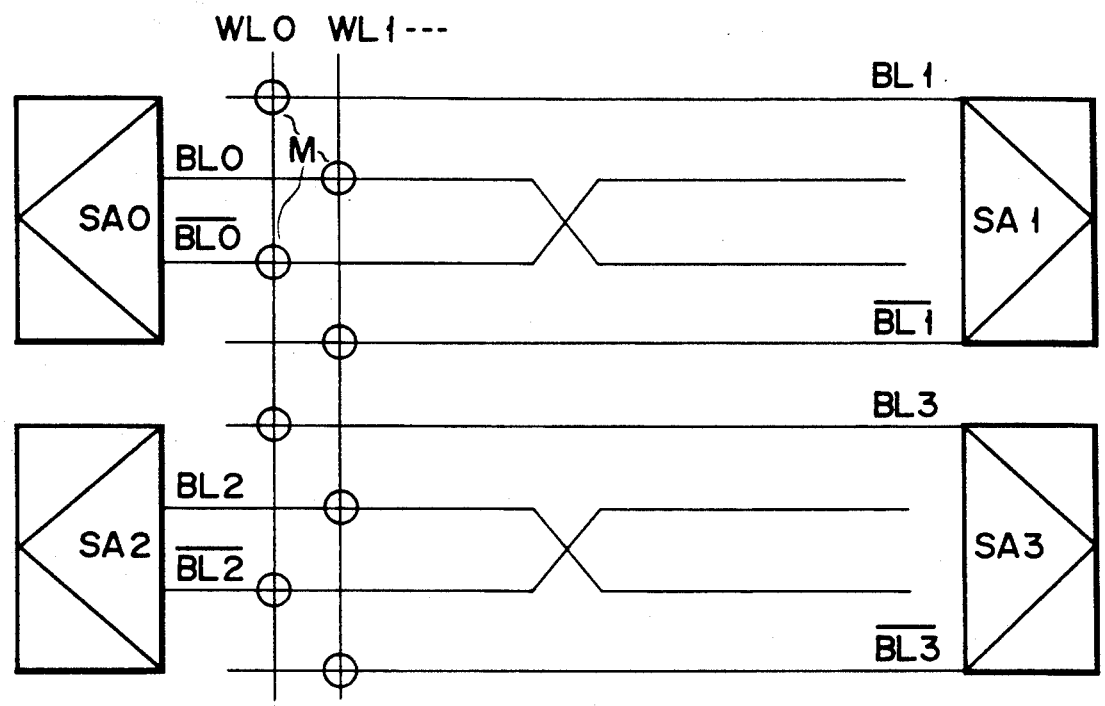
F I G. 3
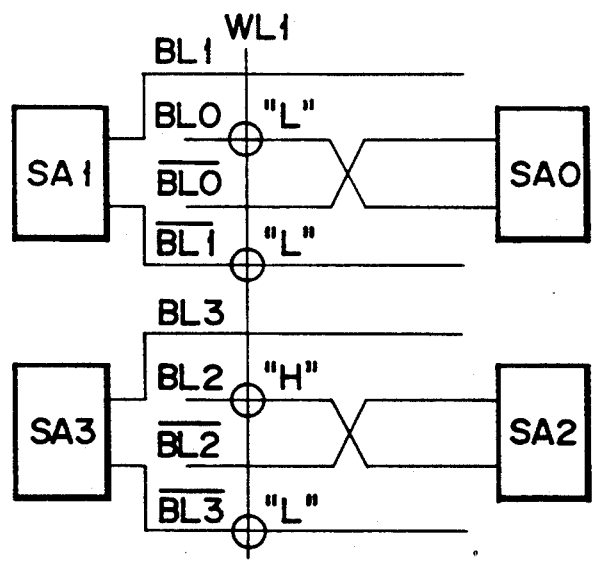
F I G. 4

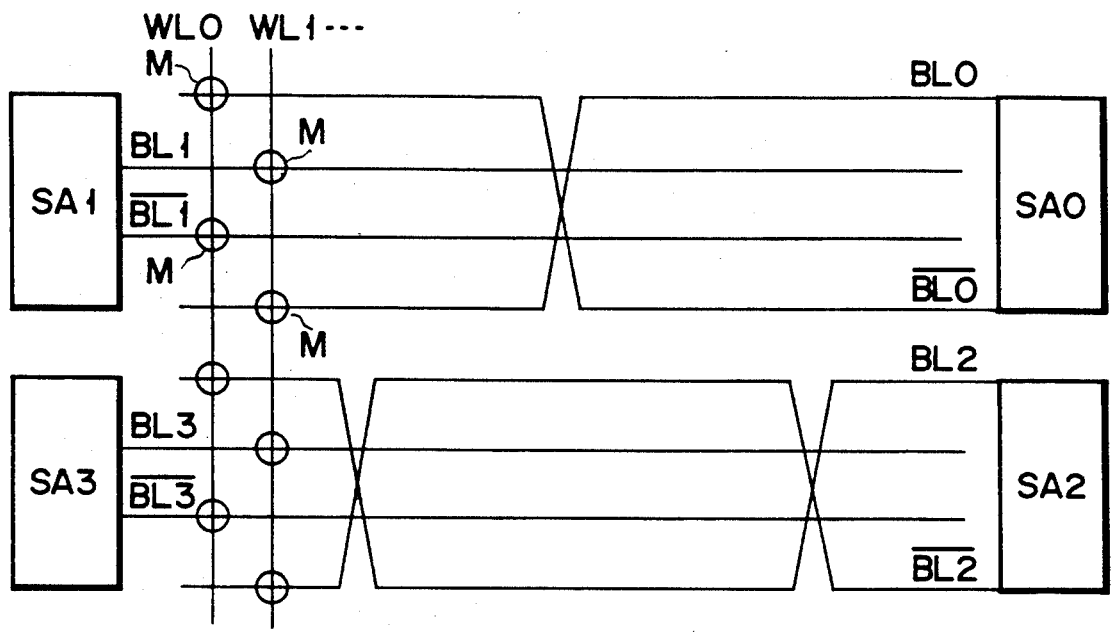

FIG. 13

| | BL0 | $\overline{BL0}$ | BL1 | $\overline{BL1}$ | BL2 | $\overline{BL2}$ | BL3 | $\overline{BL3}$ |
|---|---|---|---|---|---|---|---|---|
| BL0 | | 0 | $\frac{1}{2}C$ | $\frac{1}{2}C$ | $\frac{1}{2}C$ | $\frac{1}{2}C$ | 0 | 0 |
| $\overline{BL0}$ | 0 | | $\frac{1}{2}C$ | $\frac{1}{2}C$ | $\frac{1}{2}C$ | $\frac{1}{2}C$ | 0 | 0 |
| BL1 | $\frac{1}{2}C$ | $\frac{1}{2}C$ | | C | 0 | 0 | 0 | 0 |
| $\overline{BL1}$ | $\frac{1}{2}C$ | $\frac{1}{2}C$ | C | | 0 | 0 | 0 | 0 |
| BL2 | $\frac{1}{2}C$ | $\frac{1}{2}C$ | 0 | 0 | | 0 | $\frac{1}{2}C$ | $\frac{1}{2}C$ |
| $\overline{BL2}$ | $\frac{1}{2}C$ | $\frac{1}{2}C$ | 0 | 0 | 0 | | $\frac{1}{2}C$ | $\frac{1}{2}C$ |
| BL3 | 0 | 0 | 0 | 0 | $\frac{1}{2}C$ | $\frac{1}{2}C$ | | C |
| $\overline{BL3}$ | 0 | 0 | 0 | 0 | $\frac{1}{2}C$ | $\frac{1}{2}C$ | C | |

FIG. 14

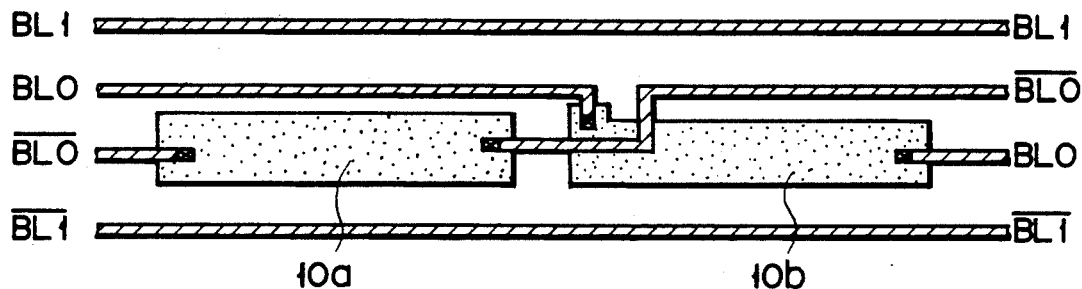
F I G. 17
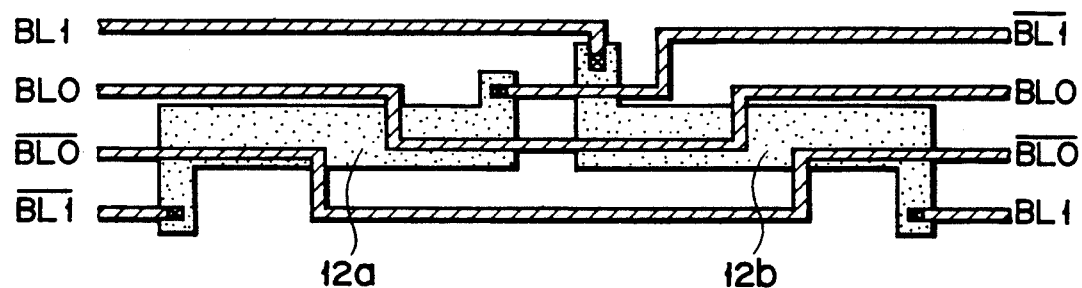
F I G. 18

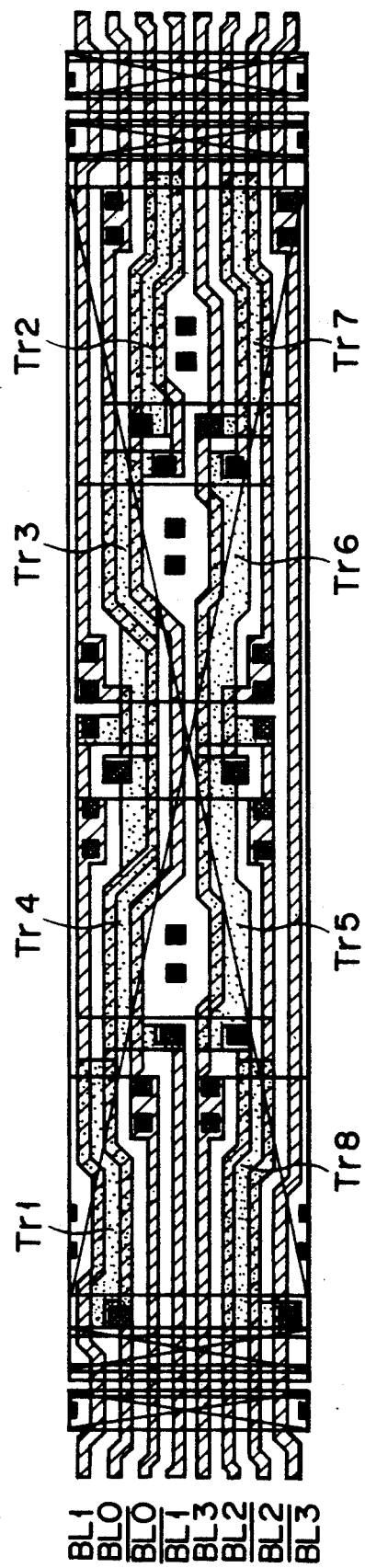
F I G. 24

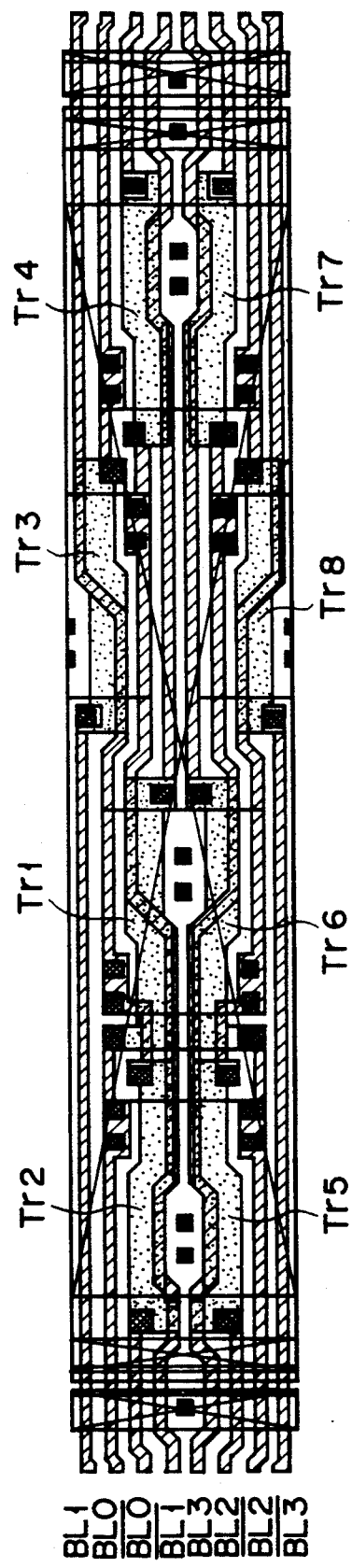
F I G. 26

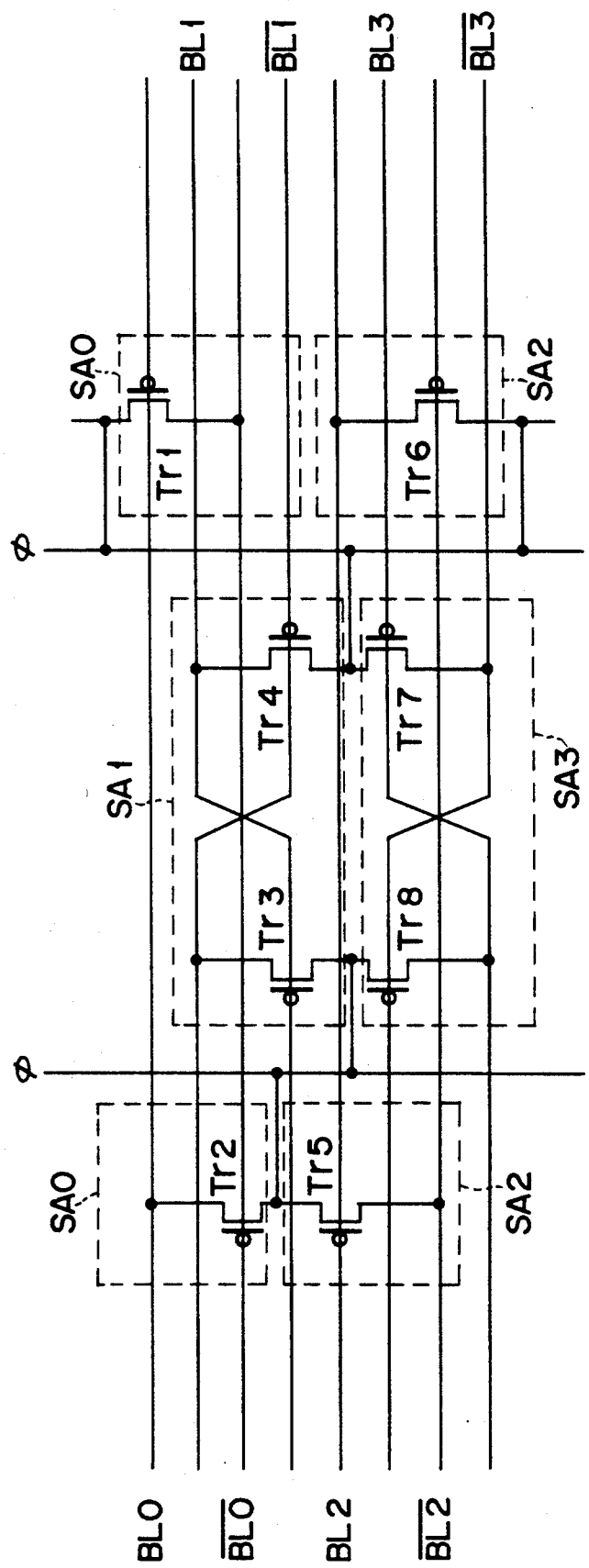
F I G. 29

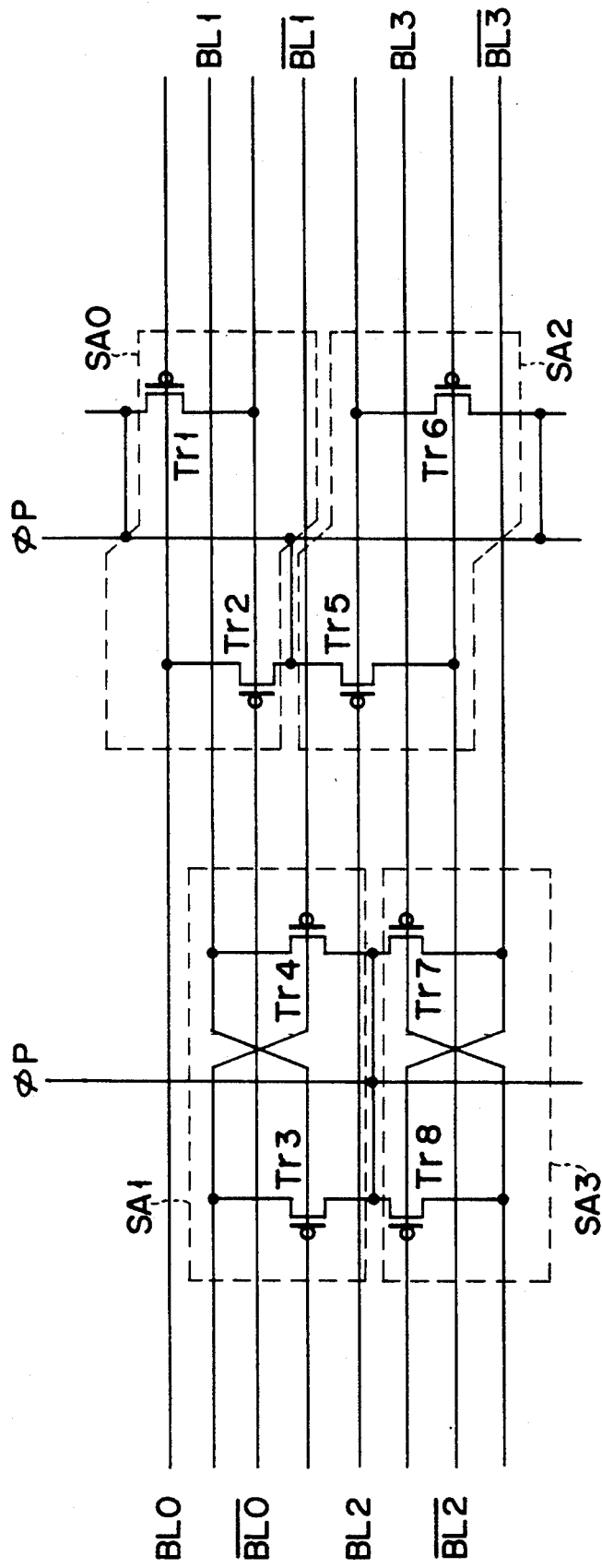
F I G. 32

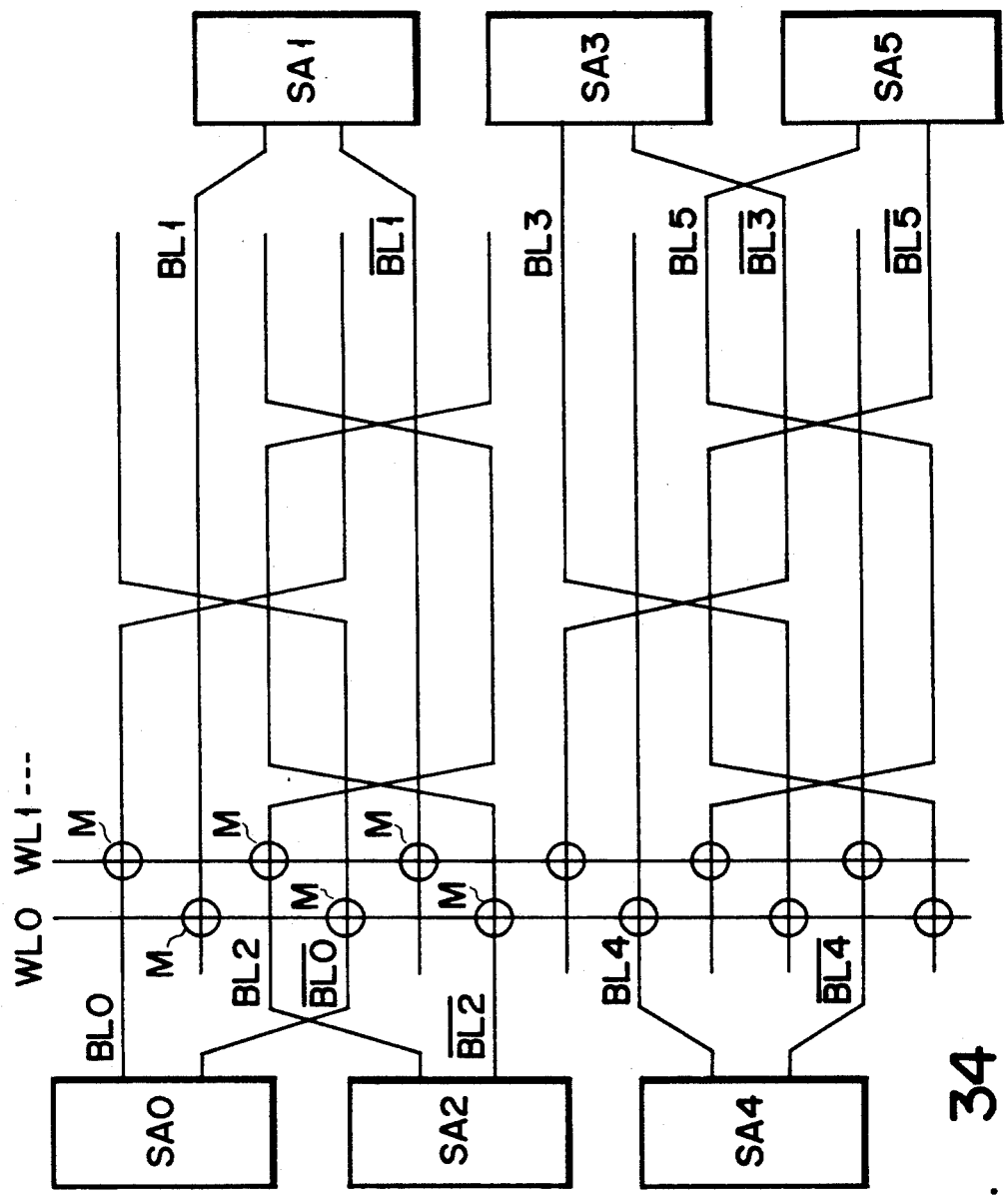
F I G. 34

|  | BL0 | $\overline{BL0}$ | BL1 | $\overline{BL1}$ | BL2 | $\overline{BL2}$ |
|---|---|---|---|---|---|---|
| BL0 |  | 0 | $\frac{1}{2}C_1$ | $\frac{1}{2}C_1$ | $\frac{1}{2}C_1$ | $\frac{1}{2}C_1$ |
| $\overline{BL0}$ | 0 |  | $\frac{1}{2}C_1$ | $\frac{1}{2}C_1$ | $\frac{1}{2}C_1$ | $\frac{1}{2}C_1$ |
| BL1 | $\frac{1}{2}C_1$ | $\frac{1}{2}C_1$ |  | 0 | $\frac{1}{2}C_1$ | $\frac{1}{2}C_1$ |
| $\overline{BL1}$ | $\frac{1}{2}C_1$ | $\frac{1}{2}C_1$ | 0 |  | $\frac{1}{2}C_1$ | $\frac{1}{2}C_1$ |
| BL2 | $\frac{1}{2}C_1$ | $\frac{1}{2}C_1$ | $\frac{1}{2}C_1$ | $\frac{1}{2}C_1$ |  | 0 |
| $\overline{BL2}$ | $\frac{1}{2}C_1$ | $\frac{1}{2}C_1$ | $\frac{1}{2}C_1$ | $\frac{1}{2}C_1$ | 0 |  |

FIG. 35

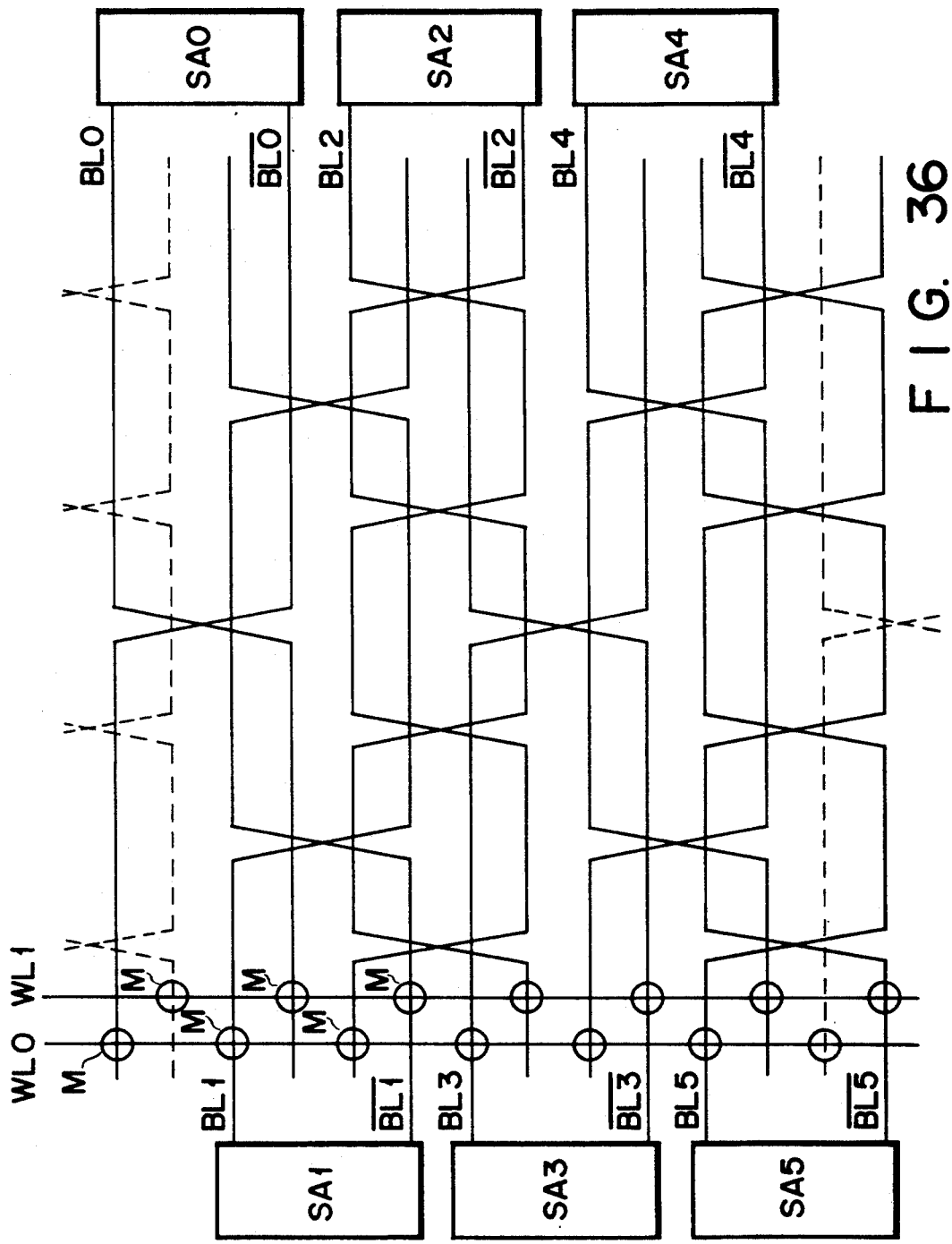
F I G. 36

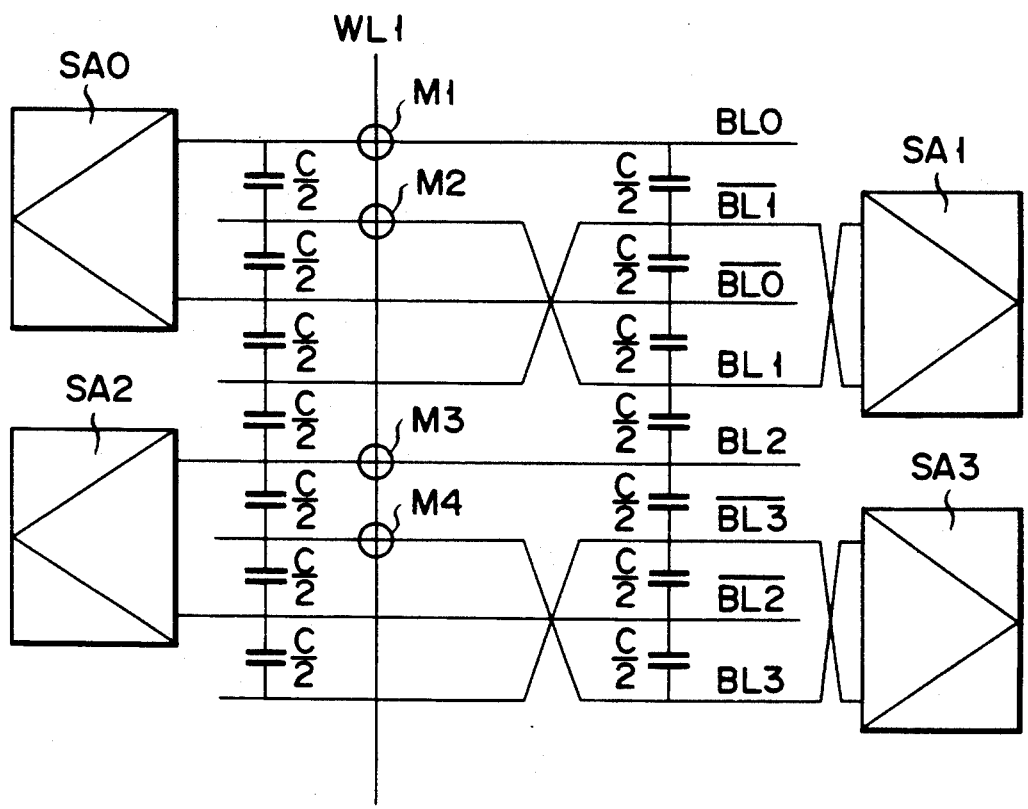
F I G. 38

5,144,583

DYNAMIC SEMICONDUCTOR MEMORY DEVICE WITH TWISTED BIT-LINE STRUCTURE

BACKGROUND OF THE INVENTION

1. Field of the Invention

The present invention relates to a semiconductor memory device, and more particularly to the technique of reducing or eliminating the noise interference among the bit lines of highly-integrated dynamic random-access memories.

2. Description of the Related Art

With the increasing needs for high speed logic performance of digital systems, it is demanded that dynamic random-access memories (hereinafter referred to as "DRAMs" as is generally called in the field of art) have higher integration density. In recent years, the integration density of DRAMs has been increased by means of the improved memory cell structure and/or the advanced micro-fabrication technology. However, the higher the integration density, the greater possibility of causing noise interference within the DRAMs, for the following reasons. The distance between any adjacent bit lines of a DRAMs is decreased due to the high integration density of the DRAM; and the coupling capacitance between the bit lines is increased. The large coupling capacitance results in a great interference noise among the bit lines. If the noise generated from the interference noise is greater than the effective potential difference of a signal supplied to a sense amplifier, the amplifier can no longer operate correctly, inevitably jeopardizing the data-reading operation of the DRAM.

SUMMARY OF THE INVENTION

It is therfore an object of the present invention to provide a new and improved semiconductor random-access memory device of a high integration density which can minimize the noise interference between the bit lines.

In accordance with the above object, the present invention is addressed to a specific semiconductor memory device, which comprises a plurality of bit-line pairs; a plurality of word lines intersecting with the bit-line pairs at right angles; and a plurality of memory cells arranged at the intersections of the bit-line pairs, on the one hand, and the word lines, on the other. A plurality of sense amplifiers are provided for the bit-line pairs, respectively. Each sense amplifier has transistors. Either or both of any two adjacent two bit-line pairs are twisted at least one part, i.e., a part substantially middle in the lengthwise direction, and have a twisted crossing section each. The twisted crossing section of each bit-line pair may be constituted by the gate electrode arrangement of one of the transistors included in the sense amplifier proved for the bit-line pair. This sense amplifier associated with the bit-line pair is located at the twisted crossing section of the bit-line pair.

The present invention and its objects and advantages will become more apparent from the detailed description of the embodiments presented below.

BRIEF DESCRIPTION OF THE DRAWINGS

In the detailed description of a preferred embodiment of this invention presented below, reference is made to the accompanying drawings, of which:

FIG. 3 is a diagram schematically illustrating the main part of the bit-line structure of a DRAM which is a preferred embodiment of the present invention;

FIG. 4 is a diagram representing the condition in which data is read from the DRAM shown in FIG. 3, such that the interference noise between the bit lines provided in the DRAM increases most;

FIG. 13 is a diagram schematically illustrating the main part of the bit-line structure of a DRAM which is still another embodiment of the present invention;

FIG. 14 is a table showing the distribution of the coupling capacitances among the bit lines incorporated in the DRAM illustrated in FIG. 13;

FIG. 17 is an enlarged plan view of the main part of the DRAM shown in FIG. 3, illustrating the actual patterning arrangement of the twisted bit-line structure of the DRAM;

FIG. 18 is an enlarged plan view of the main part of the DRAM shown in FIG. 5, representing the actual patterning arrangement of the twisted bit-line structure of the DRAM;

FIG. 24 is a plan view of the main part of the DRAM shown in FIG. 23, illustrating the layout of the actual wiring pattern of the DRAM;

FIG. 26 is a plan view of the main part of the DRAM shown in FIG. 25, illustrating the layout of the actual wiring pattern of this DRAM;

FIG. 29 is an equivalent circuit diagram illustrating the DRAM shown in FIG. 27;

FIG. 32 is a plan view of the main part of the DRAM illustrated in FIG. 29, showing the layout of the actual wiring pattern of the DRAM;

FIG. 34 is an enlarged plan view of the main part of a DRAM according to another embodiment, illustrating the actual arrangement of the bit lines of the DRAM;

FIG. 35 is a table showing the distribution of the coupling capacitances among the bit lines incorporated in the DRAM illustrated in FIG. 34;

FIG. 36 is a diagram showing a modification of the twisted bit-line structure of the DRAM illustrated in FIG. 34;

FIG. 38 is a diagram showing a modification of the twisted bit-line structure of the DRAM illustrated in FIG. 31.

DETAILED DESCRIPTION OF THE PREFERRED EMBODIMENTS

Before the embodiments of the invention are described, the conventional DRAMs will be explained with reference to FIGS. 1 and 2, in order to facilitate the understanding of the principle of the present invention.

Figure 1:
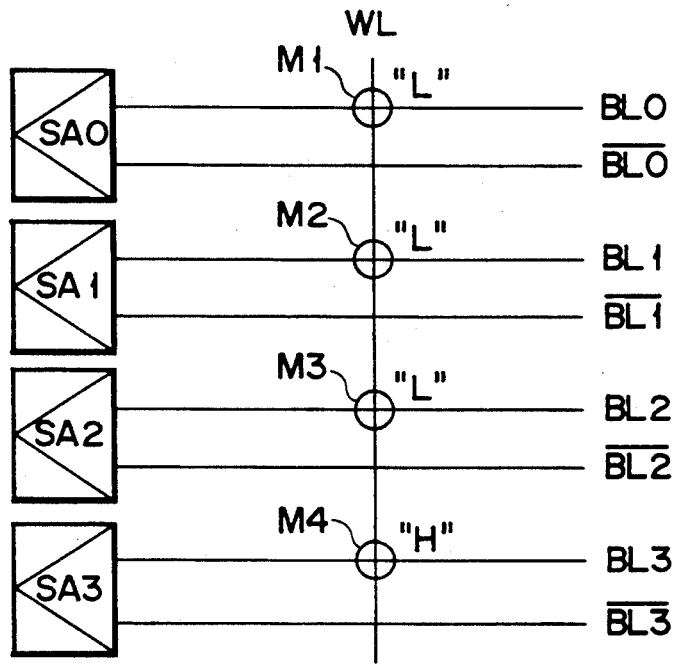
FIG. 1 is a circuit diagram showing the bit-line structure generally used in the conventional DRAMs.

FIG. 1 is a schematic representation of the folded type bit-line arrangement generally employed in DRAMs. Paris of bit lines, each consisting of two bit lines $BLi$ and $\overline{BLi}$ ($i=0, 1, 2, 3, \ldots$), are connected to sense amplifiers $SAi$ ($i=0, 1, 2, 3, \ldots$), respectively. A word line WL intersects with the bit line BL. Memory cells M1, M2, M3, M4 ... are located at the intersections of the word line WL and the bit lines BL.

The noise generated among adjacent bit line pairs essentially consists of two components $\delta 1$ and $\delta 2$: the first noise component $\delta 1$ is generated when cell data is read, whereas the second noise component $\delta 2$ is generated when a sense amplifier SA is activated. For simplicity of the analysis of noise interference between the bit lines, it is assumed here:

(1) A bit line receives noise from only the bit line immediately adjacent to it.

(2) A bit line BL is activated by ½ Vcc precharge method, wherein when a word line WL is selected, the cell data of a bit line pair appear in one bit line $BLi$ of the pair, and the potential of the other bit line $\overline{BLi}$ of the bit line pair does not change unless the noise is applied to the bit line $\overline{BLi}$ from the neighboring bit line $BL(i+1)$.

The capacitance between the bit line $BLi$, $\overline{BLi}$ of the same bit line pair is represented by "Cintra", and the capacitance between two neighboring bit lines $\overline{BL(i-1)}$, $BLi$ (or $BLi$, $BL(i+1)$) of different bit line pairs is represented by "Cinter."

When a word line WL is selected while the DRAM is set in the active mode, the data items stored in the memory cells M1, M2, ... are read onto the bit lines BL0, BL1, .... In the case of the bit-line pair coupled to the sense amplifier SA1 for a specified column, i.e., the bit lines BL1 and $\overline{BL1}$, the interference noise is most prominent when the data items stored in the memory cells M1, M2, and M3 are at "L" level, and when only the data item stored in the cell M4 is at "H" level. The noises applied to every bit line pair are shown in the following table, wherein $-Vs$ is the voltage for reading L-level data item, $+Vs$ is the voltage for reading H-level data item, and Cn is the ratio (coupling ratio) of the coupling capacitance C between the bit lines BL1 and $\overline{BL1}$ to the total capacitance Ctotal of these bit lines BL1 and $\overline{BL1}$, that is, C/Ctotal.

TABLE

| | Precharge Voltage | Signal Voltage | Cinter | Cintra |
|---|---|---|---|---|
| BL0 | (½)Vcc | −Vs | | |
| $\overline{BL0}$ | (½)Vcc | | −CnVs | −CnVs |
| BL1 | (½)Vcc | −Vs | | |
| $\overline{BL1}$ | (½)Vcc | | −CnVs | −CnVs |
| BL2 | (½)Vcc | −Vs | | |
| $\overline{BL2}$ | (½)Vcc | | +CnVs | −CnVs |

Hence, the potential difference between the bit lines BL1 and $\overline{BL1}$ connected to the sense amplifier SA1 for the specified column is given as follows:

$$\{(\tfrac{1}{2})Vcc - Vs\} - \{(\tfrac{1}{2})Vcc - 2CnVs\} = -Vs + 2CnVs \quad (1)$$

Therefore, the noise generated when the data is read out is:

$$\delta 1 = 2CnVs \quad (2)$$

Figure 2:
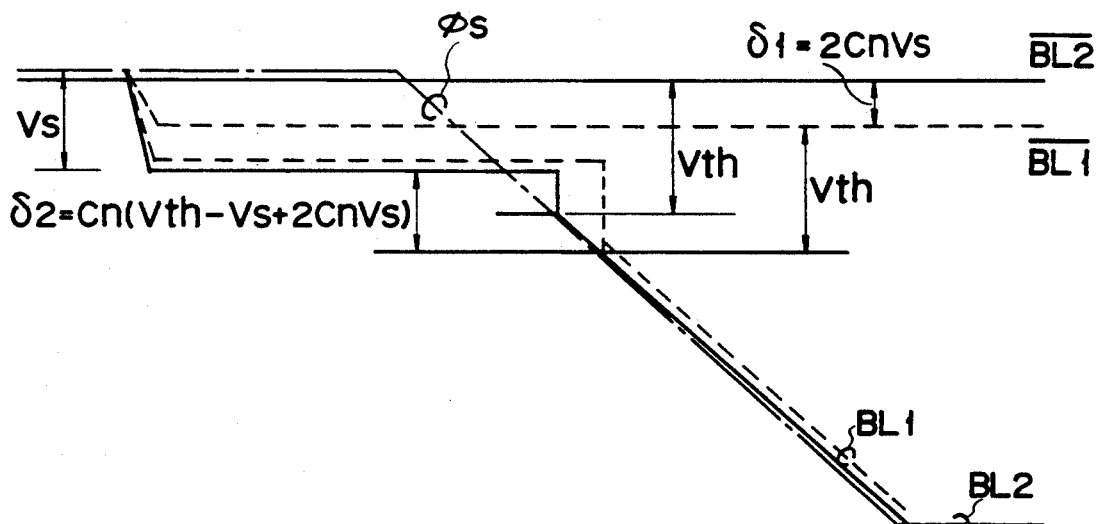
FIG. 2 is a diagram representing how the operation voltages of a conventional DRAM changes which has the bit-line structure illustrated in FIG. 1.

For simplicity of explaining the noise $\delta 2$ generated when the sense amplifiers are activated, it is assumed that each sense amplifier SA is an MOS (NMOS) sense amplifier comprising dynamic-type flip-flop circuits having n-channel type MOS transistors, and also that the common source potential $\phi$s of these MOS transistors gradually falls from the precharge value Vpc {(½)Vcc}, as is illustrated in FIG. 2 which shows how the operation-mode potential changes. In this case, the sense amplifiers SA are turned on as the common source potential $\phi$s falls, but not necessarily at the same: they may be turned on at different times. First, the sense amplifier SA2 is turned on when the potential $\phi$s falls to (½)Vcc−Vth, where Vth is the threshold voltage of the n-channel MOS transistors. The discharging of bit line BL2 is thus discharged. Thereafter, when the decreasing potential $\phi s$ equals to $(\frac{1}{2})Vcc-2CnVs-Vth$, the sense amplifiers SA0 and SA1 are turned on, whereby the bit lines BL0 and BL1 are discharged. The time lag between the discharging of the bit line BL2, on the one hand, an those of the bit lines BL0 and BL1, on the other, results in interference noise $\delta 2$. The interference noise $\delta 2$ is applied from the bit line BL2, now being discharged, to the bit line $\overline{BL1}$ for the specified column. This noise $\delta 2$ is:

$$\delta 2 = Cn\{(V_{BL2} - \overline{V_{BL2}} + Vth) + (\overline{V_{BL2}} - \overline{V_{BL1}})\} \quad (3)$$
$$= Cn(-Vs + Vth + 2CnVs)$$

From equations (2) and (3), the total interference noise $\delta t$ is:

$$\delta t = \delta 1 + \delta 2 = 2Cn^2 Vs + Cn(Vs + Vth) \quad (4)$$

This interference noise tends to increase in inverse proportion to the distance between the bit lines, which in turn is inversely proportional to the integration density of the DRAM. Hence it is most required of semiconductor manufactures to reduce or eliminate the interference noise. This requirement can be successfully fulfilled by the preferred embodiments of the present invention, which will now be described with the accompanying drawings.

As is shown in FIG. 3, a DRAM according to a preferred embodiment of the invention is of the so-called folded-type bit-line arrangement. For simplicity's sake, FIG. 3 shows only four of the bit-line pairs incorporated in this DRAM. Four dynamic sense amplifiers SA0, SA1, SA2, and SA3 are connected to the four bit-line pairs, respectively. More specifically, the sense amplifier SA0 is coupled to bit lines BL0 and $\overline{BL0}$, the sense amplifier SA1 is coupled to bit lines BL1 and $\overline{BL1}$; the sense amplifier SA2 is coupled to bit lines BL2 and $\overline{BL2}$, and the sense amplifier SA3 is coupled to bit lines BL3 and $\overline{BL3}$. Word lines WL0, WL1, . . . (only two shown in FIG. 3) insulatively intersect with the bit lines. Memory cells M are arranged at the intersections of the bit lines and the word lines. Each of these memory cells M comprises a MOS transistor and a MOS capacitor.

It should be noted that one bit line pair BLi and $\overline{BLi}$ of every two neighboring bit-line pairs extends between the other bit line pair BL(i+1) and $\overline{BL(i+1)}$ thereof, and is twisted at only one part, as is illustrated in FIG. 3. It is desirable the twisting position be a middle or center position with respect to the lengthwise direction of the bit line pair BLi, $\overline{BLi}$. The sense amplifier SAi is coupled to the ends of the bit lines BLi and $\overline{BLi}$ of one pair, whereas the sense amplifier SA(i+1) is connected to those ends of the bit lines BL(i+1) and $\overline{BL(i+1)}$ which face away from said ends of the bit lines BLi and $\overline{BLi}$.

In this embodiment, the interference noise increases most when such data items (i.e., signal potential Vs) are read from the memory cells M as is represented in FIG. 4. In this instance, the bit lines assume the potentials listed below, since the coupling capacitance between these bit lines (BLi and $\overline{BLi}$) of each twisted bit line pair is halved:

$$V_{BL0} = Vp - Vs - (\tfrac{1}{2})CnVs$$
$$V_{\overline{BL0}} = Vp - (3/2)CnVs$$
$$V_{BL1} = vp - Vs - (\tfrac{1}{2})CnVs$$
$$V_{\overline{BL1}} = vp - (3/2)CnVS$$
$$V_{BL2} = Vp + Vs - (\tfrac{1}{2})CnVs$$
$$V_{\overline{BL2}} = Vp + (\tfrac{1}{2})CnVs$$
$$V_{BL3} = Vp - Vs + (\tfrac{1}{2})CnVs$$
$$V_{\overline{BL3}} = Vp - (\tfrac{1}{2})CnVs \quad (5)$$

where Vp is the precharge potential.

As can be understood from equations (5), the noise $\delta 1 = CnVs$ for the bit lines BLi and $\overline{BLi}$ of any column. The noise $\delta 2$ will now be calculated which is generated when the sense amplifier SA1 for the specified column is activated, assuming that the sense amplifier SA1 is an NMOS sense amplifier like those used in the conventional DRAMs. The sense amplifiers SA0 to SA3 are turned on in a specific order. First, the sense amplifier SA3 is turned on. Then, the sense amplifiers SA0 and SA1 are turned on simultaneously. Thus, the discharging of the sense amplifier SA3 is the cause of the interference noise to the specified column. The noise $\delta 2$ is given:

$$\delta 2 = Cn\{(V_{BL3} - V_{\overline{BL3}} + Vth) + (V_{\overline{BL3}} - V_{\overline{BL1}})\} \quad (6)$$
$$= 2Cn^2 Vs + (Vth - Vs)Cn$$

Therefore:

$$\delta 1 + \delta 2 = 2Cn^2 Vs + VthCn \quad (7)$$

As is obvious from equation (7), the interference noise, i.e., $\delta 1 + \delta 2$, is less than the total noise $\delta t$ in the conventional DRAM having the folded bit-line arrangement, which is represented in the equation (4). In addition, since only one twisted crossing section is required for every two bit-line pairs, the DRAM chip size need not be increased to reduce the interference noise $\delta 1 + \delta 2$.

Figure 5:
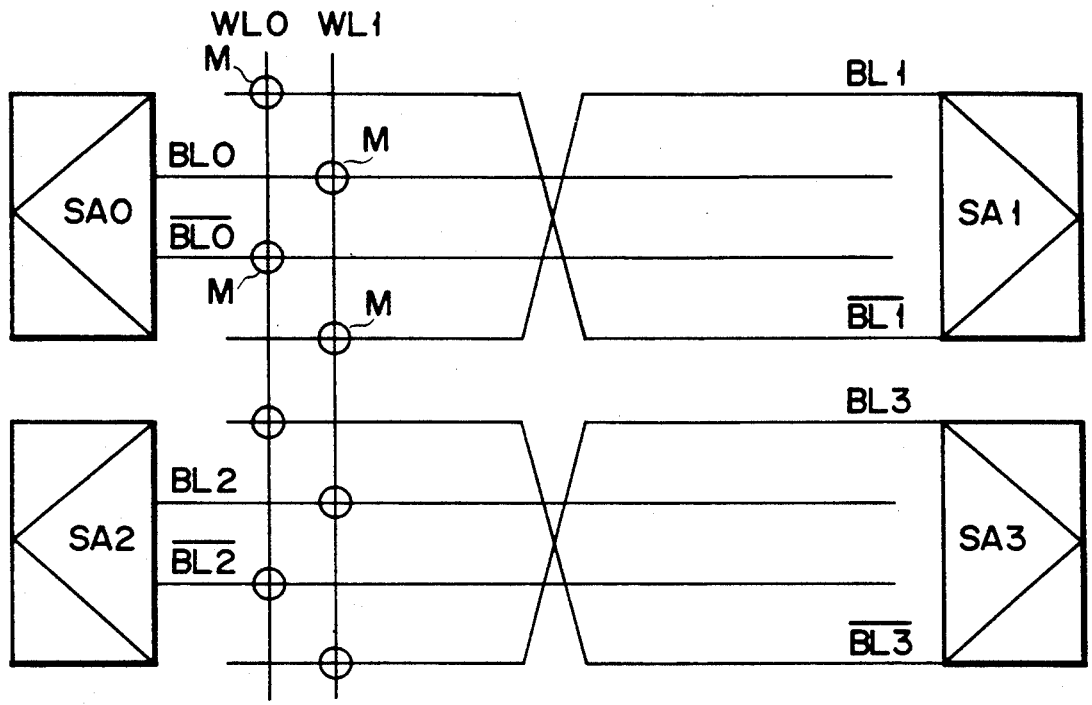
FIG. 5 is a diagram schematically illustrating the main part of the bit-line structure of a DRAM which is another embodiment of the present invention.
Figure 6:
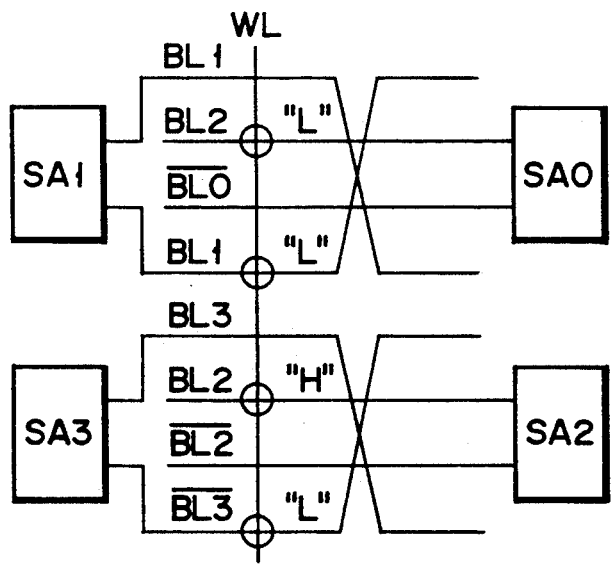
FIG. 6 is a diagram explaining the condition in which data is read from the DRAM shown in FIG. 5, such that the interference noise between the bit lines provided in this, DRAM increases most.

The twisted bit-line structure shown in FIG. 3 may be modified as is illustrated in FIG. 5. This structure is identical to the structure shown in FIG. 3 in that every two neighboring bit line pairs define an "inside" bit line pair BLi, $\overline{BLi}$ and an "outside" bit line pair BL(i+1), /BL(1+1) associated with each other. The structure of FIG. 5 is different from the structure of FIG. 3 in that the twisted bit line pair is not the inside bit line pair BLi, $\overline{BLi}$ but the outside pair BL(i+1), $\overline{BL(i+1)}$. With the DRAM having this modified twisted bit-line structure, the interference noise increases most in the condition shown in FIG. 6, or in the same conditions as is illustrated in FIG. 4.

When the twisted bit-line structures shown in FIGS. 3 and 5 are combined, then a new structure shown in FIG. 7 will be made which is called "alternate-combined twisted bit-line" structure. This structure is characterized in that, in an array of bit-line pairs every two of which are associated with each other, the bit lines of a twisted pair extend alternately inside and outside the lines of the other pair.

Figure 7:
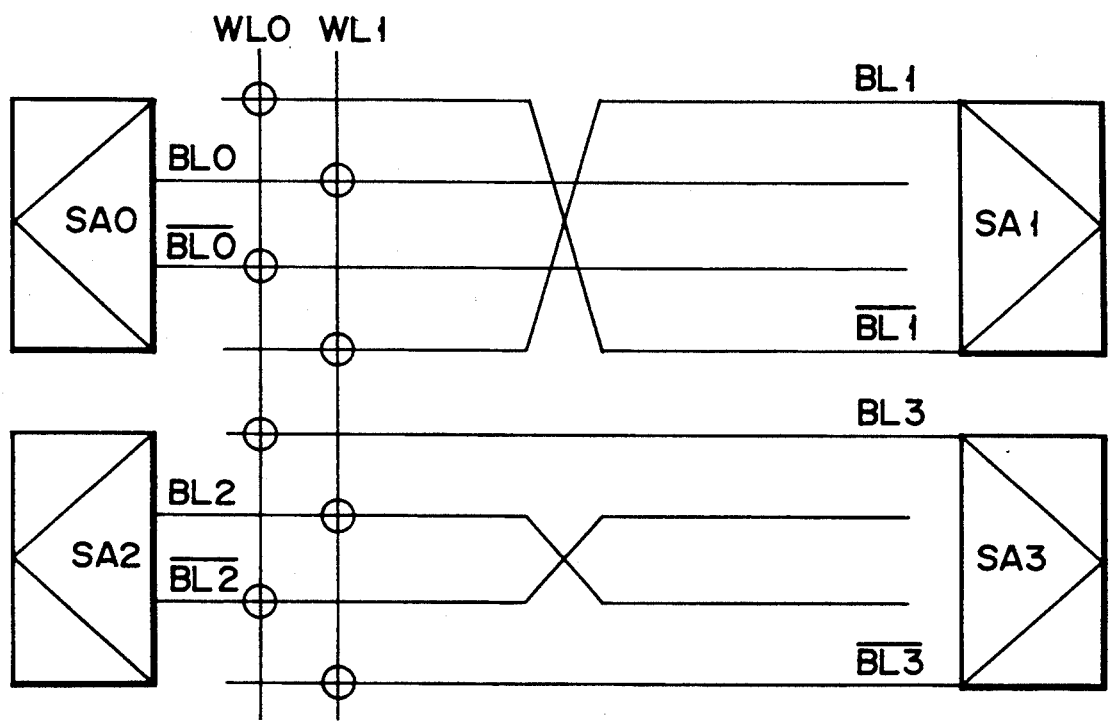
FIG. 7 is a diagram schematically illustrating the main part of the bit-line structure of a DRAM which is still another embodiment of the present invention.

The worst operating condition of the embodiment illustrated in FIG. 7 depends upon the values of noises $\delta 1$ and $\delta 2$. The worst condition will be determined, with reference to FIG. 8 which represents the condition for $\delta 1$, in which data is read from the DRAM such that the interference noise increases most, assuming that the sense amplifier SA3 is provided for the specified column.

In this condition, the bit lines have the following potentials:

$$V_{BL1} = Vp - Vs + CnVs$$

$$V_{\overline{BL1}} = Vp + CnVs$$

$$V_{BL2} = Vp - Vs - (\tfrac{1}{2})CnVs$$

$$V_{\overline{BL2}} = Vp - (3/2)CnVs$$

$$V_{BL3} = Vp - Vs$$

$$V_{\overline{BL3}} = Vp - CnVs$$

$$V_{BL4} = Vp + Vs + (\tfrac{1}{2})CnVs$$

$$V_{\overline{BL4}} = Vp + (3/2)CnVs$$

$$V_{BL5} = Vp + Vs - CnVs$$

$$V_{\overline{BL5}} = Vp - CnVs \qquad (8)$$

From equations (8) it is evident that $\delta 1 = CnVs$. The sense amplifiers adjacent to the sense amplifier SA3 for the specified column are: the sense amplifiers SA1, SA2, and SA5. When the sense amplifiers SA1, SA2, SA3, and SA5 are turned on in the order of: SA5→SA5→SA1→SA3→SA2. When the sense amplifier SA5 is turned on, the bit line $\overline{BL5}$ is discharged to increase the operation margin. Therefore:

$$\delta 2(SA5) = (\tfrac{1}{2})Cn(V_{\overline{BL5}} - V_{BL5} + Vth) + (V_{BL5} - V_{\overline{BL3}}) = -(\tfrac{1}{2})CnVth \qquad (9)$$

When the sense amplifier SA1 is turned on, the bit line BL1 is discharged to decrease the operation margin. Hence:

$$\delta 2(SA1) \; (\tfrac{1}{2})Cn\{(V_{BL1} - V_{\overline{BL1}} + Vth) + (V_{BL1} - V_{\overline{BL3}})\} \qquad (10)$$

$$= (\tfrac{1}{2})Cn(-Vs + Vth + 2CnVs)$$

Therefore, noise $\delta 1$ is given:

$$\delta 1 = \delta 2(SA2) + \delta 2(SA1) \qquad (11)$$
$$= Cn2Vs - (\tfrac{1}{2})CnVs$$

The interference noise, i.e., $\delta 1 + \delta 2$, is thus:

$$\delta 1 + \delta 2 = CnVs\{Cn + (\tfrac{1}{2})\} \qquad (12)$$

Figure 8:
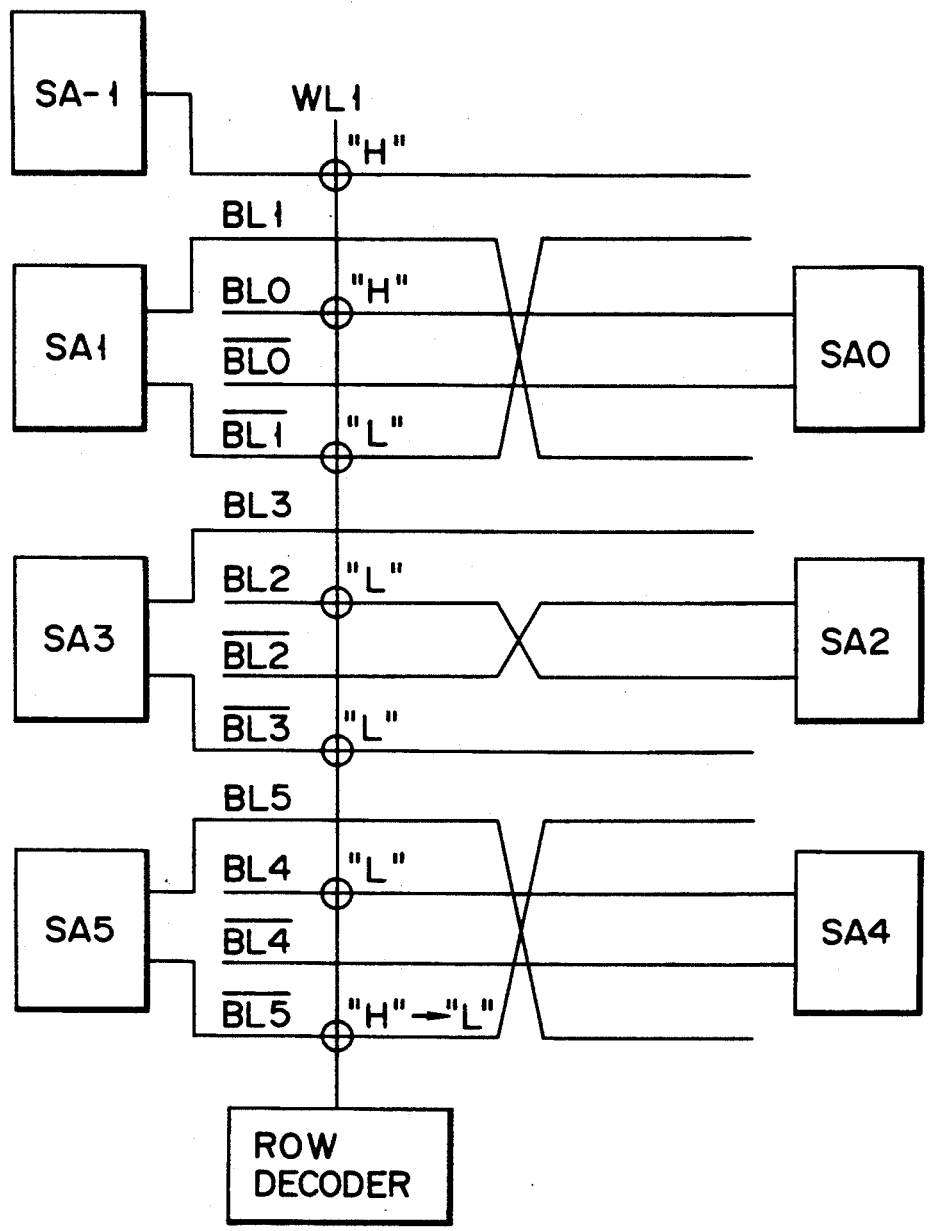
FIG. 8 is a diagram representing the condition in which data is read from the DRAM shown in FIG. 7, such that the interference noise between the bit lines provided in this DRAM increases most.

The worst condition will be determined, with reference to FIG. 8 which represents the condition for $\delta 2$, in which data is read from the DRAM such that the interference noise increases most, assuming that the sense amplifier SA3 is provided for the specified column. As has been pointed out, when the sense amplifier SA5 is turned on, the bit line $\overline{BL5}$ is discharged to increase the operation margin. If the data which sense amplifier SA5 detects is at the "L" level, not the "H" level, the sense amplifier SA5 is discharged at the same time as the sense amplifier SA3. In this case, the bit lines have the following potentials:

$$V_{BL1} = Vp - Vs + CnVs$$

$$V_{\overline{BL1}} = Vp + CnVs \; (\delta 1 = 0)$$

$$V_{BL2} = Vp = Vs - (\tfrac{1}{2})CnVs$$

$$V_{\overline{BL2}} = Vp - (3/2)CnVs \; (\delta 1 = CnVs)$$

$$V_{BL3} = Vp - Vs - CnVs$$

$$V_{\overline{BL3}} = Vp - CnVs \; (\delta 1 = 0)$$

$$V_{BL4} = Vp - Vs - (\tfrac{1}{2})CnVs$$

$$V_{\overline{BL4}} = Vp - (3/2)CnVs$$

$$V_{BL5} = Vp - Vs - CnVs$$

$$V_{\overline{BL5}} = Vp - CnVs \; (\delta 1 = 0) \qquad (13)$$

From equations (13) it is clear that the sense amplifiers SA1, SA2, SA4, and SA5 are turned on in the order of: SA1→SA3, SA5→SA2, SA4. Hence, it is the discharging of the bit line BL1 which is the cause of the noise to the specified column. Therefore:

$$\delta 2 = (\tfrac{1}{2})Cn\{(B_{BL1} - V_{\overline{BL1}} + Vth) + (V_{\overline{BL1}} - V_{\overline{BL3}})\} \qquad (14)$$
$$= (\tfrac{1}{2})Cn(-Vs + Vth + 2CnVs)$$

Thus:

$$\delta 1 + \delta 2 = Cn^2 Vs + (\tfrac{1}{2})Cn(Vth - Vs) \qquad (15)$$

Equation (15) represents the worst condition in which data is read from the DRAM. The interference noise generated in the embodiment shown in FIG. 5 is less than that generated in the conventional DRAM shown in FIG. 1 and the embodiment illustrated in FIG. 3. In every two neighboring bit-line pairs, only one bit-line pair is twisted, the DRAM chip size need not be increased in order to reduce the interference noise.

Figure 9:
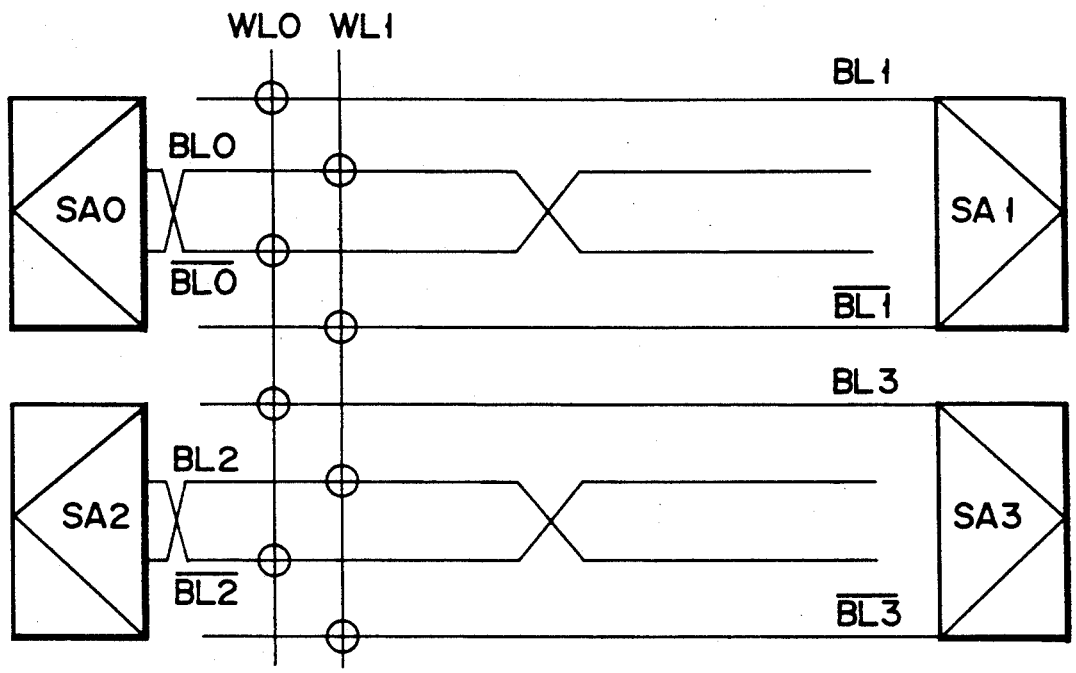
FIGS. 9, 10, and 11 are diagrams illustrating three modifications of the embodiments shown in FIGS. 3, 5, and 7, respectively.
Figure 10:
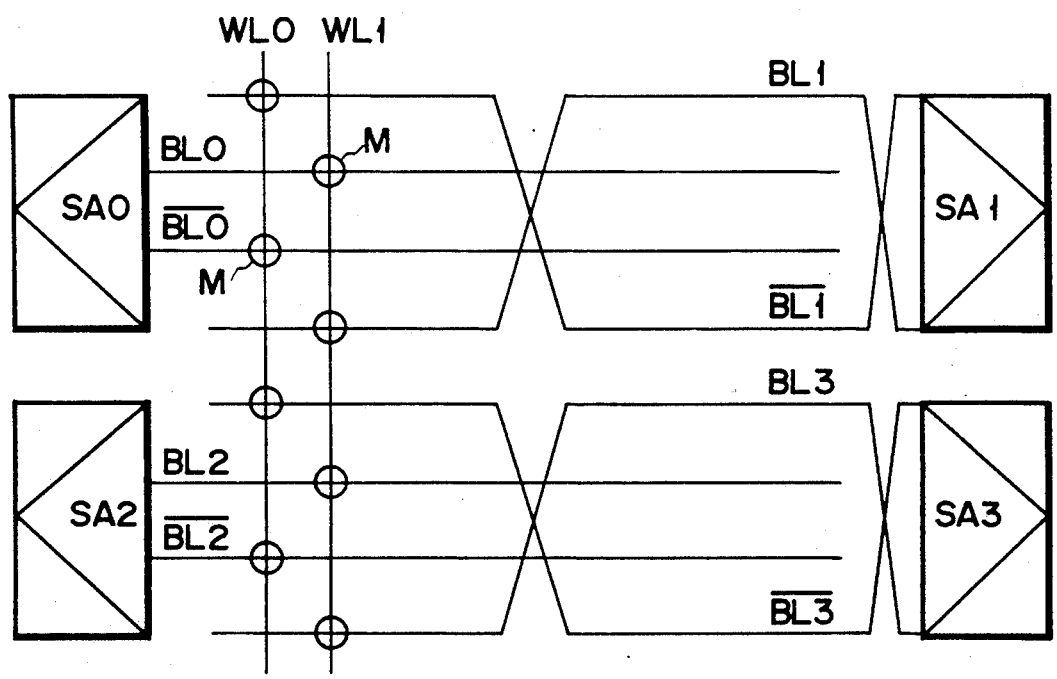
Figure 11:
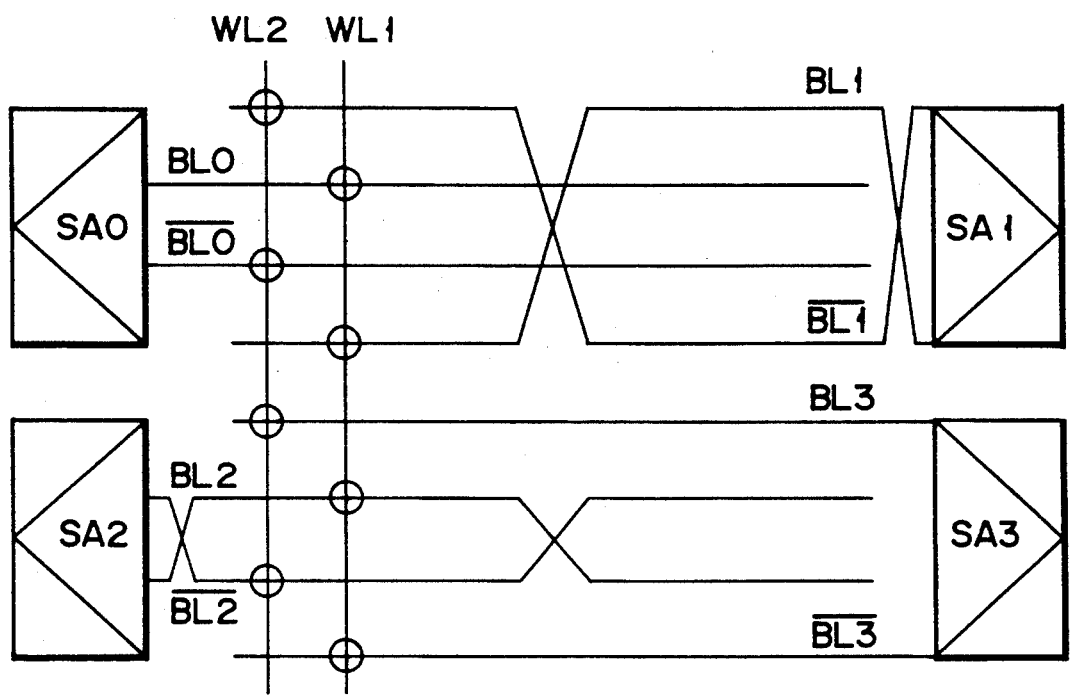

In the embodiments described above, one pair of every neighboring pairs associated with each other is twisted at one portion. These embodiments may be modified such that one of every neighboring bit-line pairs is twisted at two portions as is illustrated in FIGS. 9, 10, and 11. These modifications are identical in that the second twisted crossing section is located close to the sense amplifier to which the bit lines of the twisted pair are connected. In the modification shown in FIG. 9, which is known as "two-point twisted bit-line" structure, the "inside" bit-line pair (i.e., lines BL0 and $\overline{BL0}$), extending between the "outside" bit line pair BL1, $\overline{BL1}$, is twisted at the middle portion and also at the portion close to the sense amplifier SA0. The other modifications shown in FIGS. 10 and 11 have similar "two-point twisted bit-line" structure. The analysis of interference noise, set forth above, can be applied to the modifications shown in FIGS. 9, 10, and 11, too.

Figure 12:
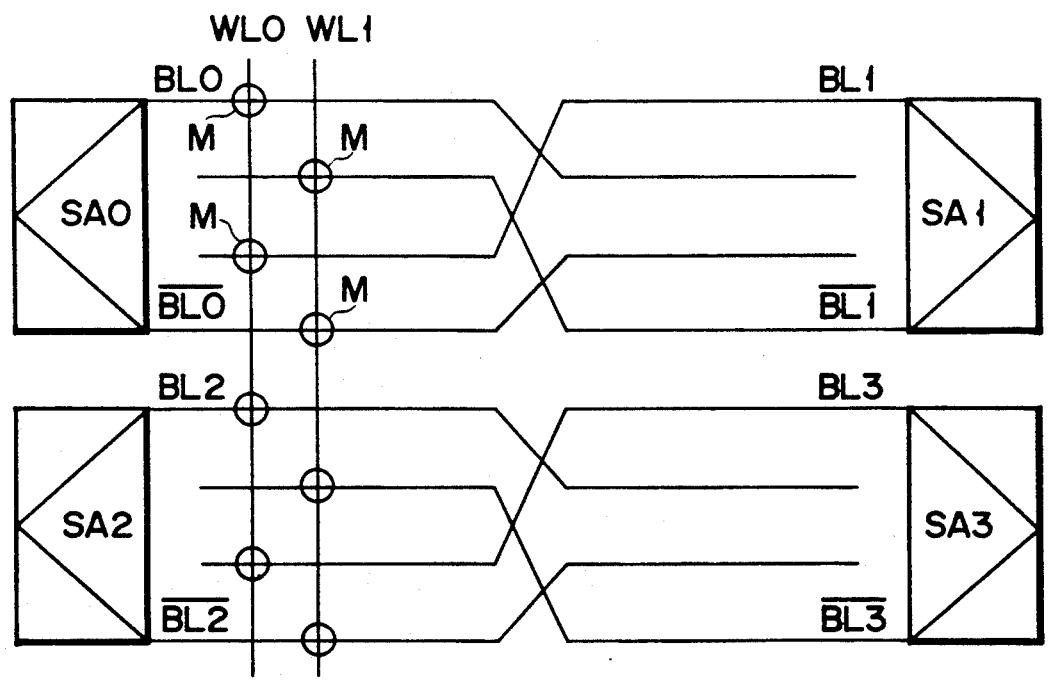
FIG. 12 is a diagram schematically illustrating the main part of the bit-line structure of a DRAM which is another embodiment of the present invention.

FIG. 12 illustrates another embodiment of the invention, in which one (BL1, $\overline{BL1}$) of every two neighboring bit-line pairs associated with each other is twisted at the middle portion thereof. The bit line pair BL1, $\overline{BL1}$ is connected at the first end section to memory cells M, and connected at the second end section to a sense amplifier SA1. These bit lines BL1 and $\overline{BL1}$ are bent such that their first end portions are spaced apart less than the second end portions. The bit lines BL0 and $\overline{BL0}$ of the other pair are connected at the first end section to memory cells M and also to a sense amplifier SA0. The first end portions of the bit lines BL0 and $\overline{BL0}$ are spaced apart more than the second end portions. The first end portions of the bit lines BL1 and $\overline{BL1}$ extent between the first end portions of the bit lines BL0 and $\overline{BL0}$, and the second end portions of the bit lines BL0 and $\overline{BL0}$ extend between the second portions of the bit lines BL1 and $\overline{BL1}$. In other words, the positional relationship which the left halves of the bit lines of both pairs have is opposite to the relationship which the right halves of these bit lines have.

FIG. 13 shows another embodiment which is identical to the embodiment shown in FIG. 3 in that one of every two neighboring bit line pairs extend between the other thereof. The embodiment shown in FIG. 13 is different in that the other pair of every other two-pair unit is twisted at two portions. More specifically, as is shown in FIG. 13, the "outside" bit-line pair (i.e., lines BL0 and $\overline{BL0}$) of a two adjacent bit line pair is twisted at the middle portion, $(\frac{1}{2})L$; the "outside" bit-line pair (i.e., lines BL2 and $\overline{BL2}$) of the next two bit-line pairs is twisted at two positions, i.e., positions $(\frac{1}{4})L$ and $(\frac{3}{4})L$, where L is the length of the bit lines BL2 and $\overline{BL2}$. With such a twisted bit-line arrangement, the undesirable coupling capacitances among the bit lines are reduced effectively, as is shown in FIG. 14.

Figures 15, 16:
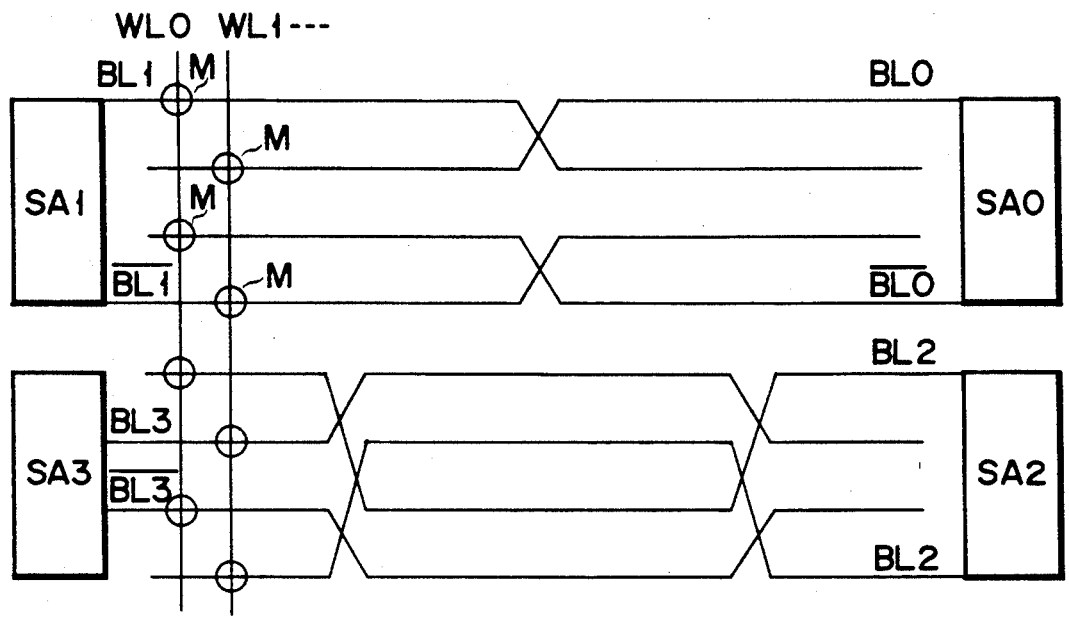
FIG. 15 is a diagram schematically illustrating the main part of the bit-line structure of a DRAM which is another embodiment of the present invention.
FIG. 16 is a table showing the distribution of the coupling capacitances among the bit lines incorporated in the DRAM illustrated in FIG. 15.

FIG. 15 illustrates still another embodiment of the present invention, which is a combination of the embodiments shown in FIGS. 12 and 13. The undesirable coupling capacitances among the bit lines are reduced sufficiently, as is evident from FIG. 16.

Some typical twisted bit-line structures according to the invention, which have a few twisted crossing sections for reducing interference noise, have been described with reference to equivalent circuit diagrams. An exploration into the twisting technique actually applied in DRAM bit-line structures will clarify the advantages of the present invention which the manufacturers of semiconductor device would appreciate with joy and surprise.

Generally, any twisted bit-line structure must be combined with one or more additional multi-layered contact sections, in order that it is actually incorporated into a DRAM. However, if the DRAM according to the invention has a so-called "wing-shaped" bit-line structure wherein bit-line sense amplifiers SA are located in the middle of the cell array, the gate-electrode layers of the MOS transistors included in each sense amplifier can be used to form the two crossing twisted bit lines. In this case, no additional multi-layered contact sections are required, and the number of layers constituting the DRAM does not increase at all. This means that DRAMs which not only have a high integration density but also operate very reliably can be manufactured by employing the presently available manufacturing technology, without requiring any complicated manufacturing processes.

For example, the patterning arrangement shown in FIG. 17 is applied in order to incorporate the twisted bit-line structure shown in FIG. 3 into a DRAM. More specifically, to twist the "inside" pair of bit lines BL0 and $\overline{BL0}$ which extend between the "outside" pair of bit lines BL1 and $\overline{BL1}$, at their middle portions, the gate-electrode layers 10a and 10b (both dot-illustrated) of the MOS transistors connected to the bit lines BL0 and $\overline{BL0}$ are used as parts of the bit lines BL0 and $\overline{BL0}$, respectively. The bit line BL0 insulatively extends above the gate-electrode layer 10b. The gate-electrode layers 10a and 10b are the first polycrystalline silicon thin-film layer, and the bit lines BL0 and $\overline{BL0}$ are the second polysilicon thin-film layer; no third layer is required for an additional wiring pattern in order to form the twisted bit-line structure shown in FIG. 3 in the DRAM.

The patterning arrangement shown in FIG. 18 is applied in order to incorporate the twisted bit-line structure shown in FIG. 5 into a DRAM. When the "inside" bit line pair BL0, $\overline{BLO}$ having no twisted crossing sections is positioned between the "outside" pair of bit lines BL1, $\overline{BL1}$ having the twisted crossing section, gate-electrode layers 12a and 12b of MOS transistors included in the sense amplifier connected to this bit-line pair (i.e., bit lines BL0 and $\overline{BL0}$) are used as part of the twist-contact section. These gate-electrode layers 12a and 12b are the first polysilicon thin-film layer. The bit lines BL0 and $\overline{BL0}$ are the second polysilicon thin-film layer extending above the first polysilicon layer and is insulated therefrom. One bit line (BL1) of the "outside" bit line pair runs beneath the "inside" bit line pair BL0, $\overline{BL0}$ with gate-electrode layer 12b being used as a "bypass" line, thereby to constitute a "grade separation" connection. The other bit line ($\overline{BL1}$) of the "outside" bit line pair extends beneath the bit line pair BL0, $\overline{BL0}$ with gate-electrode layer 12b as a bypass line.

Figure 19:
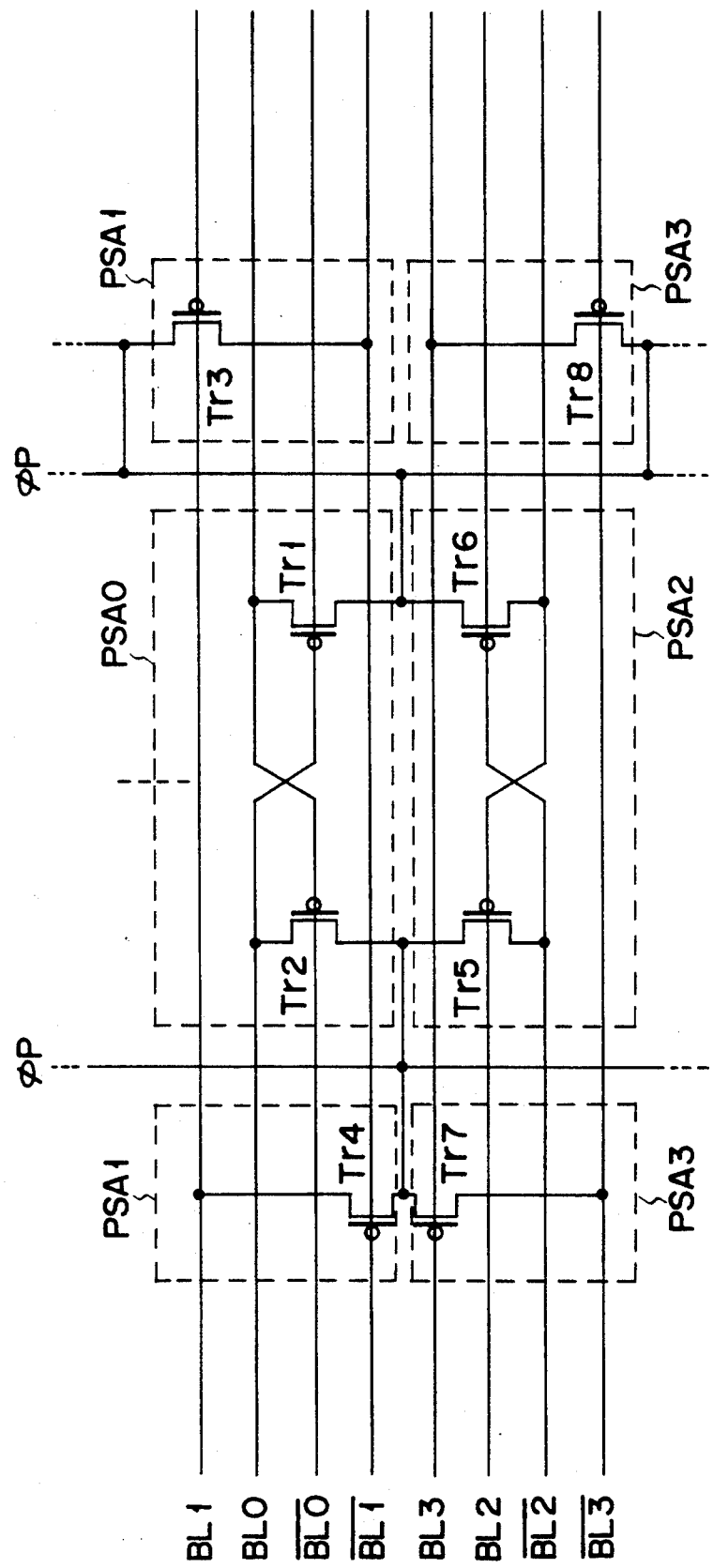
FIG. 19 is an equivalent circuit diagram illustrating the DRAM shown in FIG. 17.
Figure 20:
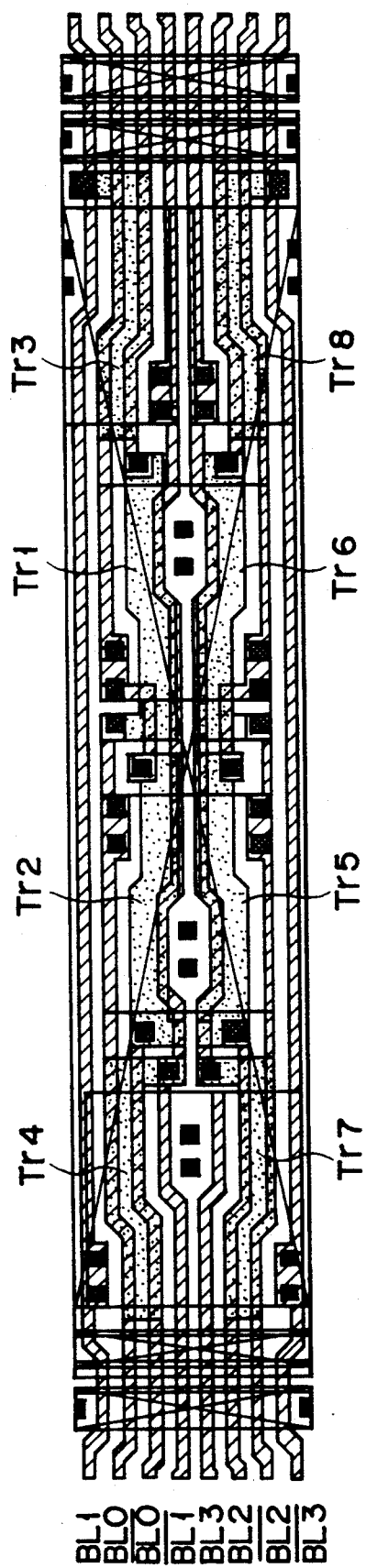
FIG. 20 is a plan view of the main part of the DRAM shown in FIG. 17, illustrating the layout of the actual wiring pattern of the DRAM.

FIG. 19 is an equivalent circuit diagram showing the embodiment shown in FIG. 17, and FIG. 20 is a plan view illustrating the layout of the actual wiring pattern of this embodiment. It should be noted that the embodiment shown in FIG. 17 has two types of sense amplifiers SA, each provided for two neighboring bit-line pairs. The first type is an NMOS sense amplifier (i.e., dynamic flip-flop) having n-channel MOS transistors. The second type is a PMOS sense amplifier (i.e., dynamic flip-flop) having p-channel MOS transistors. For the sake of simplicity, only the PMOS sense amplifiers are illustrated in FIG. 19. The NMOS sense amplifiers can be formed together with the PMOS sense amplifiers within the memory cell array. Alternatively, they can be located on both sides of the memory cell array, set apart from the PMOS sense amplifiers.

As is shown in FIG. 19, the PMOS sense amplifier PSA0 is connected to the bit lines BL0 and $\overline{BL0}$ of the first pair. The PMOS sense amplifier PSA0 has two transistor Tr1 and Tr2. Two transistors Tr3 and Tr4 are connected to the bit lines BL1 and BL0 of the second pair. The transistors Tr1, Tr2, Tr3, and Tr4 have an elongated gate electrode each, and are arranged in the direction in which the bit lines extend. The first bit-line pair (i.e., lines BL0 and $\overline{BL0}$), which extends between the bit lines BL1 and $\overline{BL1}$ of the second pair, is twisted, by using the gate electrodes of the MOS transistors Tr1 and Tr2, in the specific way explained with reference to FIG. 17. The bit lines BL2, $\overline{BL2}$, BL3, and $\overline{BL3}$ of the next two neighboring pairs, and the components of the PMOS sense amplifiers PSA2 and PSA3 connected to the bit lines BL2, $\overline{BL2}$, BL3, and $\overline{BL3}$ are arranged in the same pattern.

Units identical to the structure shown in FIGS. 19 and 20, which is associated with four pairs of bit lines, are arranged along each word line WL. Hence, each of the MOS transistor included in any sense amplifier is associated with four bit lines. This makes it relatively easy to arrange the MOS transistors even if the bit lines are located at short intervals.

Figure 21:
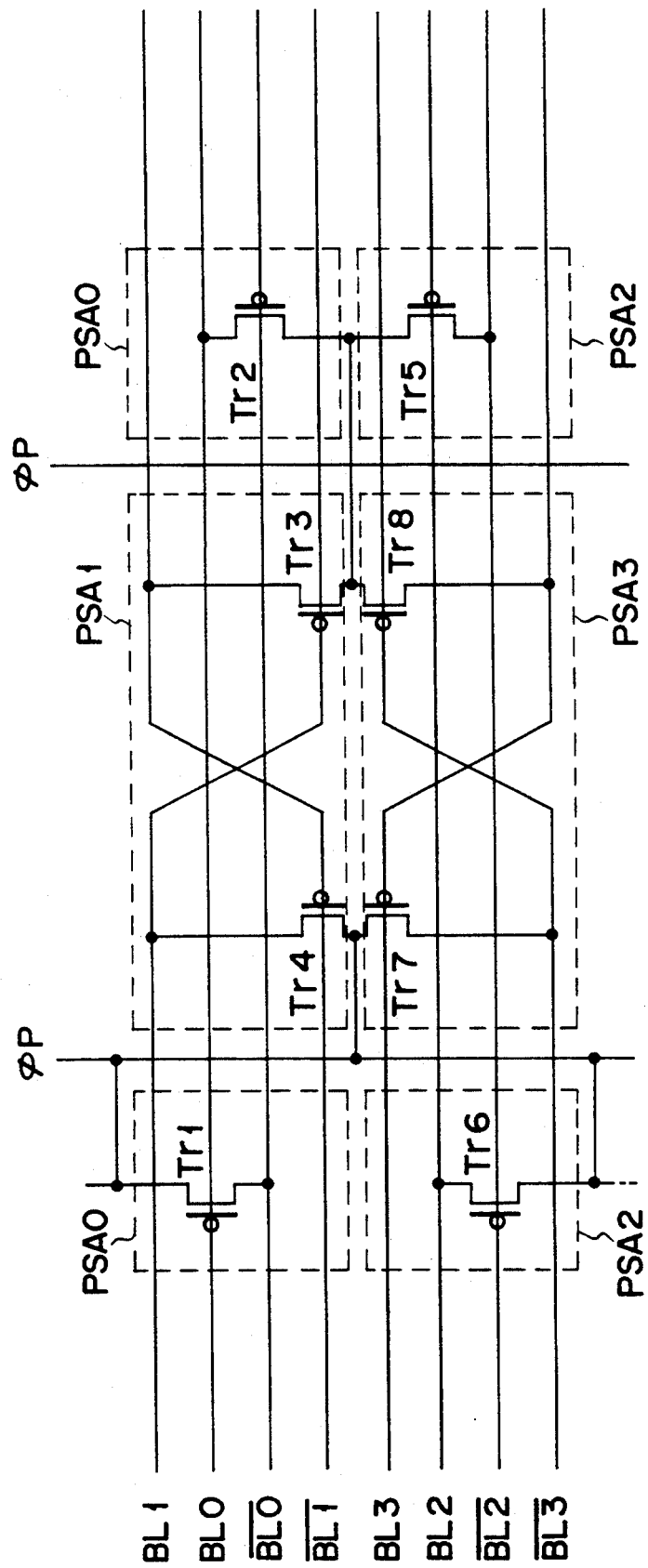
FIG. 21 is an equivalent circuit diagram illustrating the DRAM shown in FIG. 18.
Figure 22:
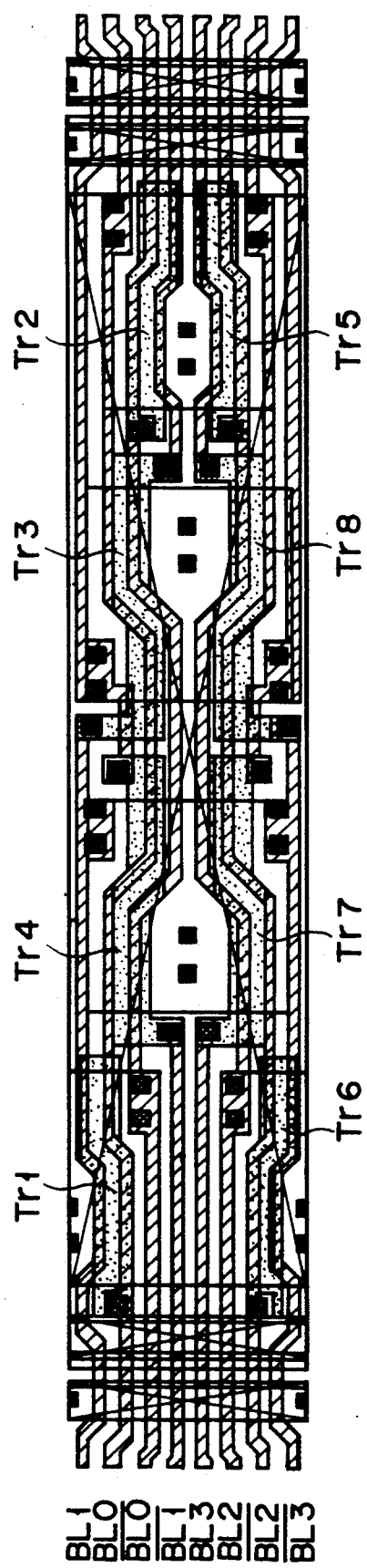
FIG. 22 is a plan view of the main part of the DRAM shown in FIG. 18, illustrating the layout of the actual wiring pattern of this DRAM.

FIG. 21 is an equivalent circuit diagram showing the embodiment shown in FIG. 18; and FIG. 20 is a plan view illustrating the layout of the actual wiring pattern of the embodiment shown in FIG. 18. The embodiment of FIG. 18 is obtained by modifying the embodiment of FIG. 5 so that the sense amplifiers are located in the middle of the bit lines. The same components are designated at the same reference symbols as those used in FIGS. 19 and 20, and will not be described in detail. In this embodiment, the "outside" pair of every two neighboring bit-line pairs is twisted. Such twisting bit-line structure may be achieved by using the gate electrodes of the MOS transistors incorporated in the PMOS sense amplifiers PSA1, PSA3, . . . that are located in the middle of the bit lines, in accordance with the technique explained above with reference to FIG. 18.

Figure 23:
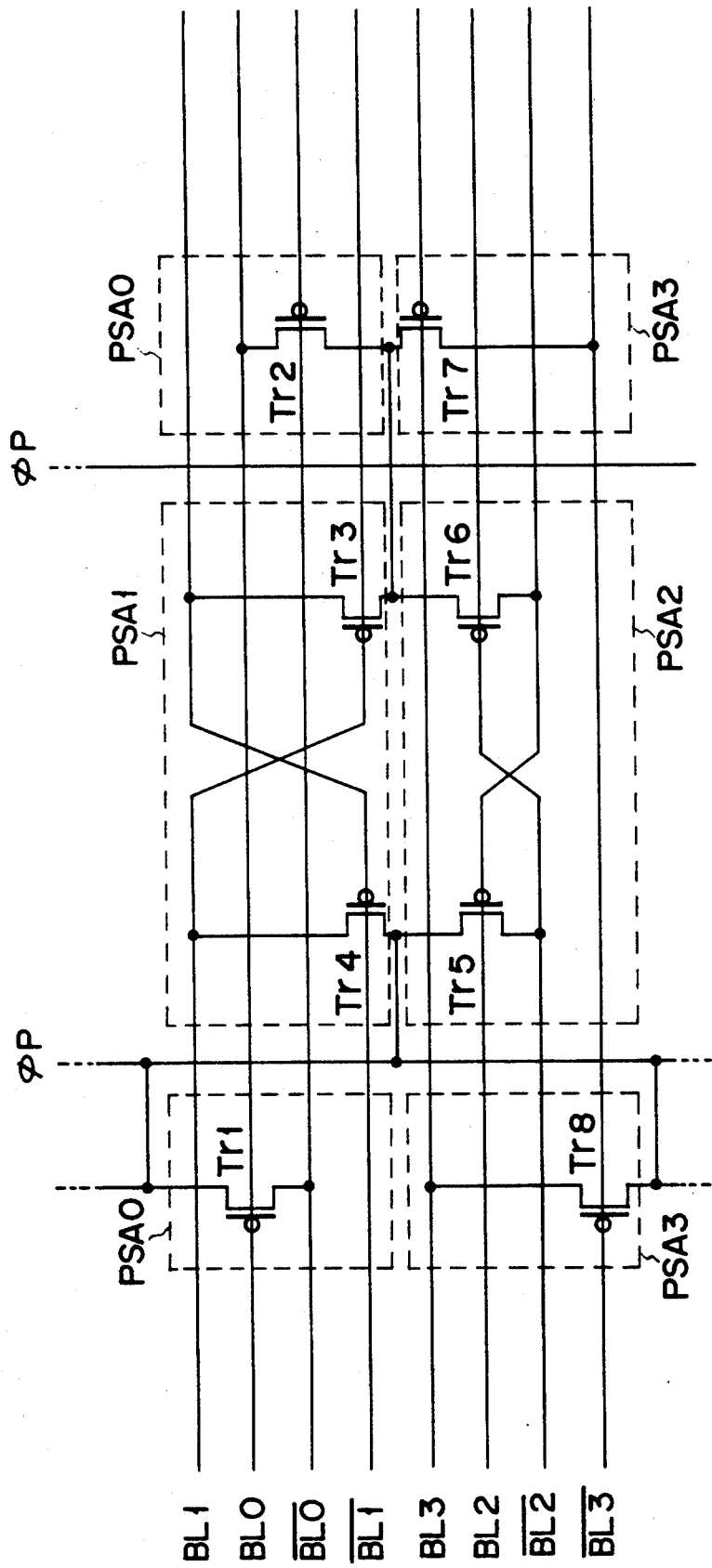
FIG. 23 is a circuit diagram showing the main part of a modification of the DRAM shown in FIG. 7, wherein sense amplifiers are located at the middle portions of the bit-line pairs.

FIG. 23 is an equivalent circuit diagram showing an example that is obtained by modifying the embodiment shown in FIG. 7 in such a manner that the sense amplifiers are located at the middle position along the extending direction of the bit lines; and FIG. 24 is a plan view illustrating the layout of the actual wiring pattern of this modification. In FIGS. 23 and 24, the same symbols denote the same components as those shown in FIG. 21. In this modification, the "outside" pair is twisted in two adjacent bit-line pairs, whereas the "inside" pair is twisted in the next two adjacent bit line pairs. This specific twisted bit-line structure may be achieved by employing both patterning arrangements shown in FIGS. 17 and 18 in such a manner as to use the gate electrodes of the MOS transistors incorporated in the PMOS sense amplifiers PSA1, PSA2, ... that are located in the middle of the bit lines.

Figure 25:
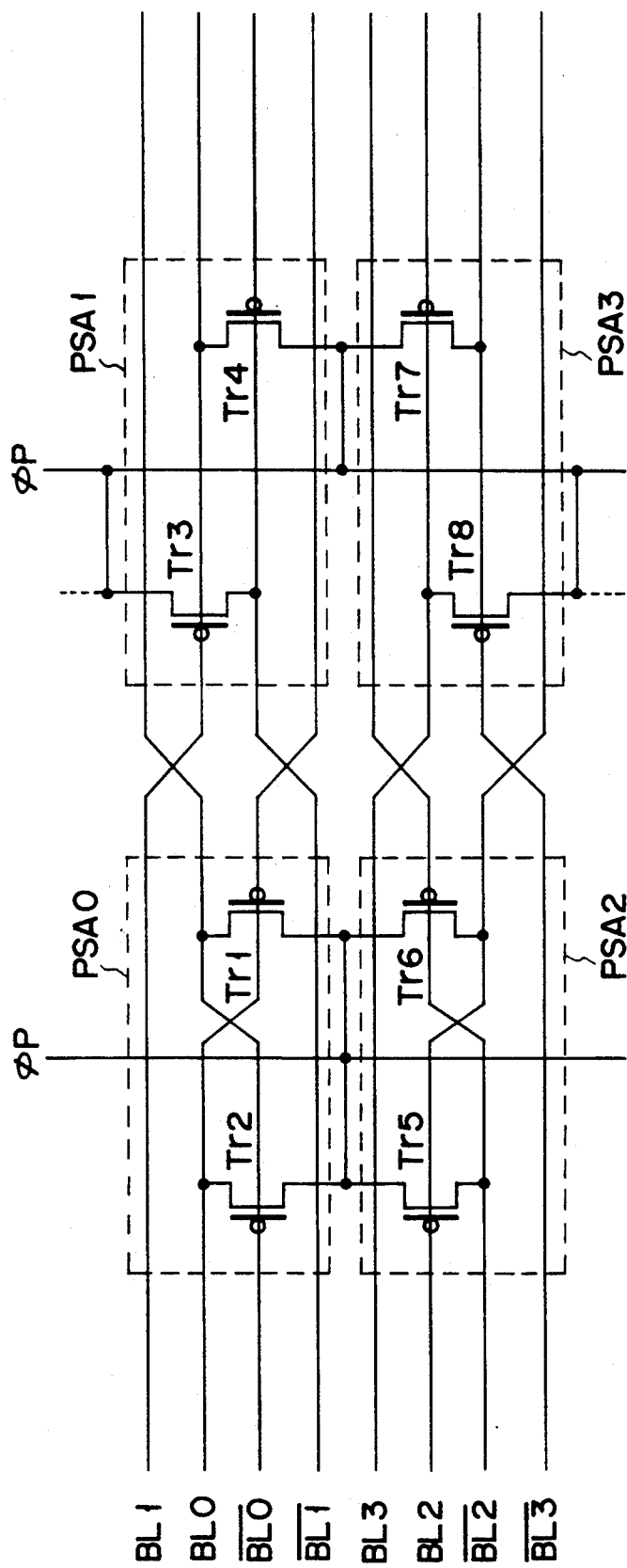
FIG. 25 is a circuit diagram showing the main part of a modification of the DRAM shown in FIG. 12, wherein sense amplifiers are located at the middle portions of the bit-line pairs.

FIG. 25 is an equivalent circuit diagram showing a modification of the embodiment shown in FIG. 13, in which sense amplifiers are located in the middle portions of the bit lines. The actual wiring pattern of this modification is illustrated in detail in FIG. 26.

Figure 27:
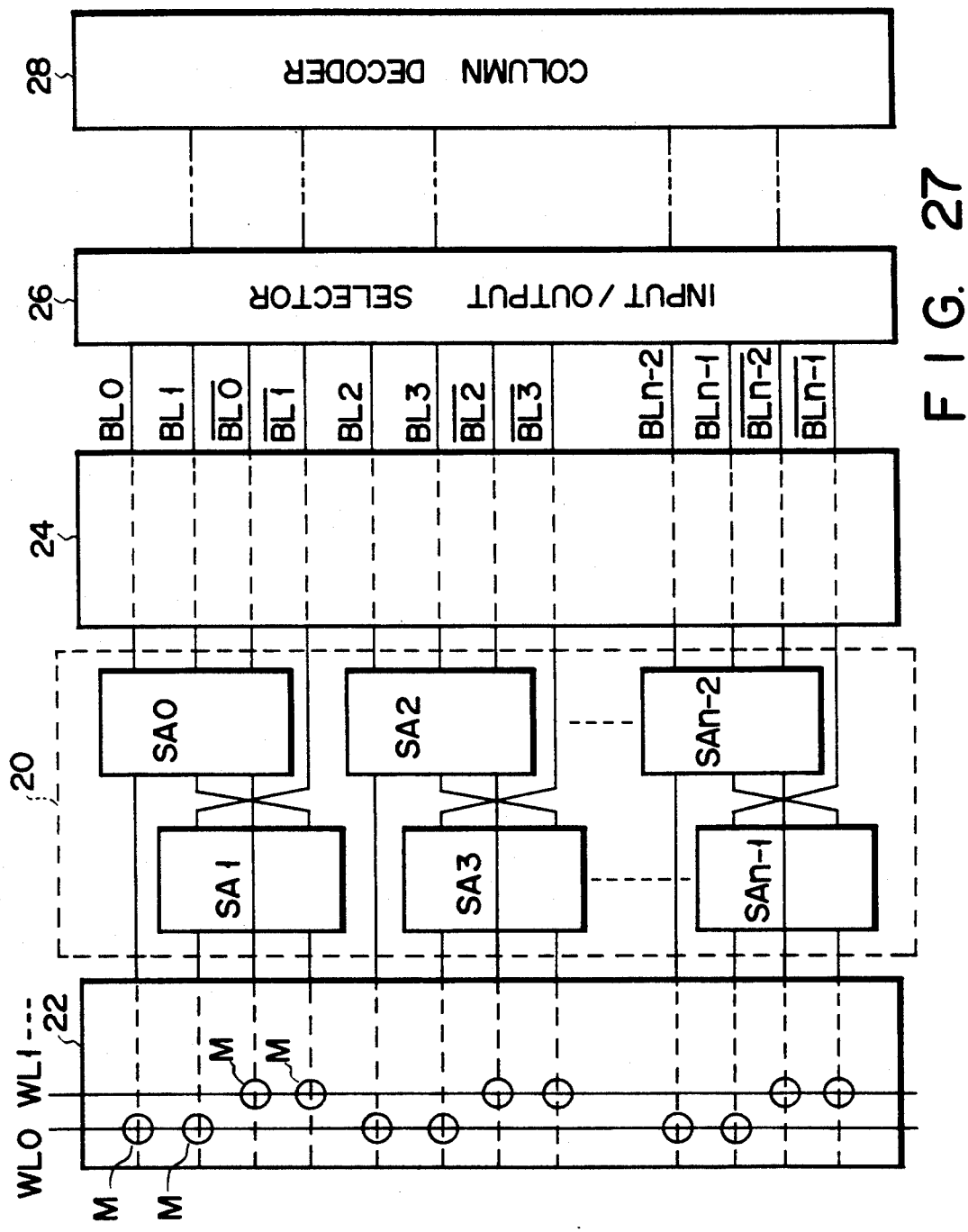
FIG. 27 is a diagram schematically illustrating the main part of the bit-line structure of a DRAM which is still another embodiment of the present invention.

The twisted bit-line structure of an embodiment shown in FIG. 27 is differs from the previous embodiments in the following aspects:

(a) One pair of two neighboring bit line pairs, i.e., bit line pair BLi, $\overline{BLi}$ and bit line pair BL(i+1), $\overline{BL(i+1)}$, positionally includes therebetween a certain bit line of the other bit line pair of the two neighboring bit line pair.

(b) The aforementioned one pair in the two neighboring bit line pair has no twisted crossing sections.

(c) Only the other pair of the two neighboring bit line pairs is twisted at one portion, thus forming a twisted crossing section.

With such an arrangement, it is possible to almost completely eliminate interference noise that is internally generated in each pair of the two neighboring bit line pairs BLi, $\overline{BLi}$, BL(i+1), and $\overline{BL(i+1)}$, since the certain bit line of one pair which extends between the bit lines of the associated pair functions as an electrical shield for suppressing interference noise. This "internal" noise elimination effect may greatly enhance the operational reliability of the DRAM, in combination with the "external" noise suppressing effect of preventing interference noise from being applied externally to the twisted bit line pair of the two neighboring bit line pairs BLi, $\overline{BLi}$, BL(i+1), and /$\overline{BL(i+1)}$.

More specifically, as shown in FIG. 27, the DRAM has a "wing"-shaped bit-line structure, wherein a forming region 20 of forming sense amplifiers SA is defined between the first and second memory cell regions 22 and 24 on a known substrate that is not illustrated in this drawing. The bit-line pairs BL, $\overline{BL}$ are connected to input/output selection circuit 26, which in turn is connected to the column decoder section 28. Word lines WL0, WL1, . . . insulatively intersect with the bit lines BL, $\overline{BL}$ in the first memory-cell region 22. Memory cells M are located at the intersections of each word line WLi and the bit line of every other pair in such a manner that two memory cells on any word line WLi are staggered with respect to the two memory cells M connected on the adjacent word line WL(i−1) and also with respect to the two memory cells M connected on the other adjacent word line WL(i+1).

Figure 28:
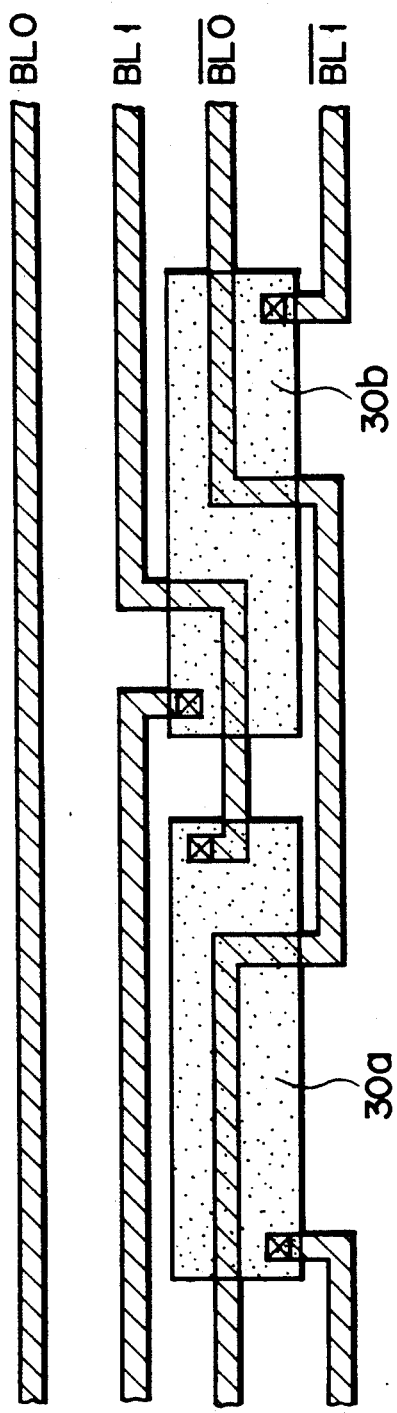
FIG. 28 is an enlarged plan view of the main part of the DRAM shown in FIG. 27, representing the actual patterning arrangement of the twisted bit-line structure of the DRAM.

The twisted bit-line structure shown in FIG. 27 will be described in detail, particularly two associated bit-line pairs, the first of which consists of bit lines BL0 and $\overline{BL0}$ and the second of which consists of bit lines BL1 and $\overline{BL1}$. (The bit lines of any two other pairs associated with each other are arranged in the same way as those of the first two pairs.) Bit lines BL0 and $\overline{BL0}$ are parallel with each other. One of bit lines BL1 and $\overline{BL1}$, i.e., bit line BL1 in this embodiment, extends between bit lines BL0 and $\overline{BL0}$, and is twisted at a middle position thereof. In order to realize the twisted crossing structure, no additional contact sections are required for the following reason. The twisted crossing section is located in the sense amplifier region 20, and the gate-electrode layers 30a and 30b (see FIG. 28) of the MOS transistors included in the sense amplifier SA1 coupled to the bit lines BL1 and $\overline{BL1}$ are used to form the twisted crossing section in substantially the same way as in the embodiments described above. The circuit diagram of the twisted bit-line structure shown in FIG. 28 is illustrated in FIG. 29. The actual wiring pattern layout of this twisted bit-line structure is shown in FIG. 30.

Figure 30:
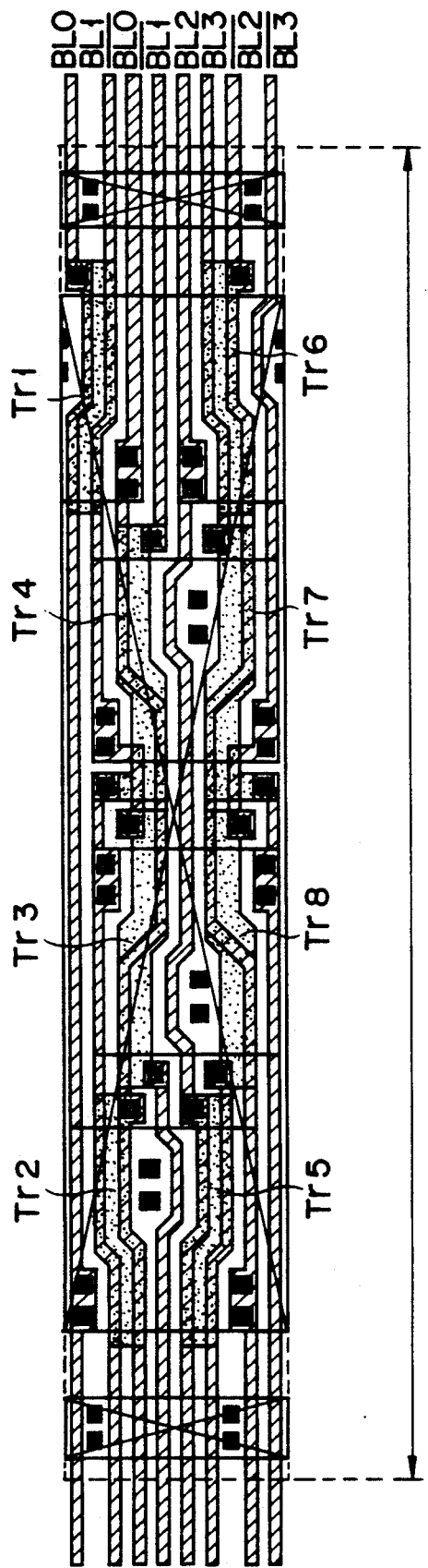
FIG. 30 is a plan view of the main part of the DRAM shown in FIG. 27, showing the layout of the actual wiring pattern of this DRAM.
Figure 31:
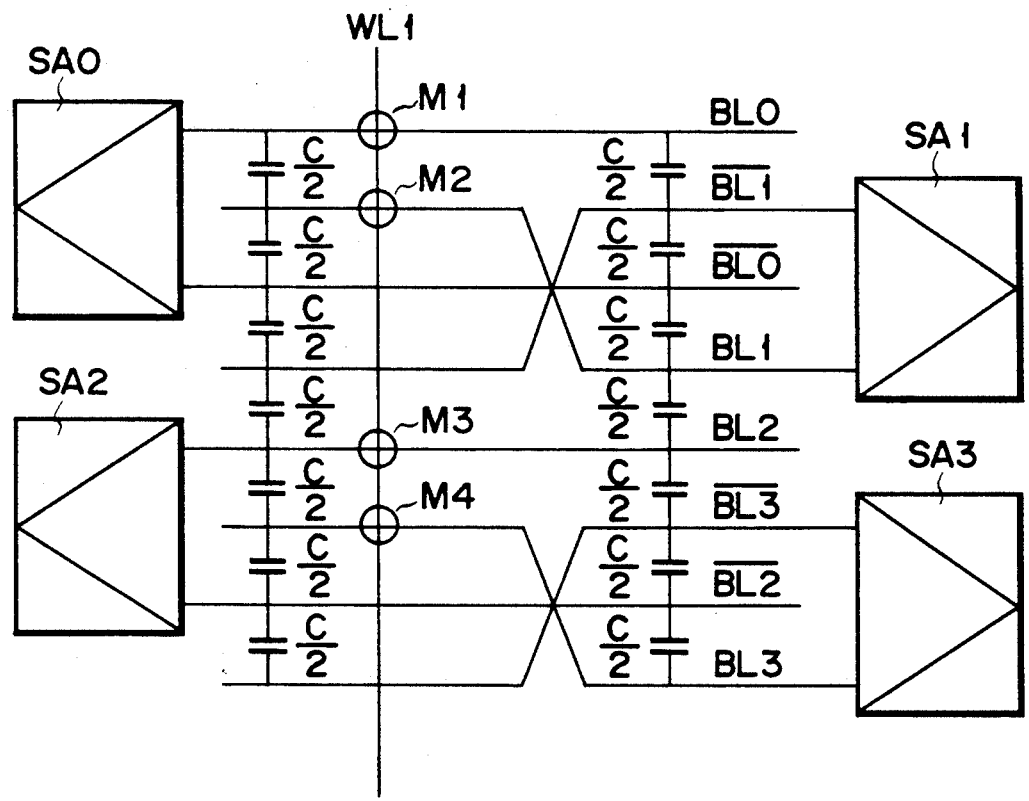
FIG. 31 is a diagram showing a twisted bit-line structure which is electrically equivalent to the embodiment shown in FIG. 27, and in which sense amplifiers are provided at both ends of any pair of bit lines.

The suppression of the interference noise, which is possible with the twisted bit-line structure shown in FIG. 27, will be analyzed and discussed in more detail, with reference to FIG. 30 showing an example that is electrically equivalent to the bit-line structure illustrated in FIG. 27. In FIG. 31, the same reference symbols designate the same components as those shown in FIG. 27. The capacitors shown in this figure are equivalent to the coupling capacitances present among the adjacent bit lines.

Now let us assume that Cinter=Cintra=C. As is shown in FIG. 31, bit lines BL1 and $\overline{BL1}$, both connected to the sense amplifier SA1, are located close to bit lines BL0 and $\overline{BL0}$, respectively. Since the bit lines BL1 and $\overline{BL1}$ are not adjacent to each other, the interference noise between these lines is very small. Since the bit lines BL1 and $\overline{BL1}$ cross with each other at their middle portions, the noise-suppressing effects on them are substantially equal. The interference noise resulting from the bit line BL2 does not influence the potential difference between the bit lines BL1 and $\overline{BL1}$, and does not reduce the operation margin of the sense amplifier SA1. The interference noise applied from the bit lines BL0 and $\overline{BL0}$ to the bit lines BL1 and $\overline{BL1}$ does not influence the potential difference between the bit lines BL and $\overline{BL1}$, either.

With respect to the sense amplifier SA2, the neighboring bit lines adjacent to bit lines BL2 and $\overline{BL2}$ are bit lines BL1, $\overline{BL1}$, BL3, $\overline{BL3}$. Now let us consider about the "worst" case wherein the interference noise increases most when an "H"-level data item, an "L"-level data item, and an "L"-level data item are read from the memory cells M2, M3, and M4, respectively. In this case, the bit line BL1 applies interference noise to the bit line BL2. Since the distance between the bit lines BL1 and BL2 is half the length of either bit line, the noise is about 50% less than otherwise. The interference noise applied from the left half of the bit line BL3 is canceled out since the coupling capacitance between the bit lines BL3 and BL2 is equal to that between the bit lines BL3 and $\overline{BL2}$. Hence, the left half of the bit line BL3 applies no noise to the bit line BL2. The right half of the bit line BL3 applies interference noise to the bit line $\overline{BL2}$, but this noise is equivalent to only half the coupling capacitance determined by half the length of any bit line of this twisted bit-line structure. No interference noise is generated between the bit lines BL2 and $\overline{BL2}$ since they are not adjacent to each other. The bit lines $\overline{BL1}$ and $\overline{BL3}$ have a reference potential, e.g., $(\frac{1}{2})Vcc$, which remains unchanged. Hence, in the worst possible condition, the interference noise applied to the bit line BL2 is $+(C/2)\Delta V$, and the interference noise applied to the bit line $\overline{BL2}$ is $-(C/2)\Delta V$, the total noise being $C\Delta V$. ($\Delta V$ is the change in the bit-line potential, which occurs when data is read from the memory cells M1 to M4. Obviously, the total noise $C\Delta V$ is half the interference noise $2C\Delta V (= \Delta V + Cintra \Delta V)$ generated in the conventional bit-line structure, i.e., the folded-type structure.

Figure 33:
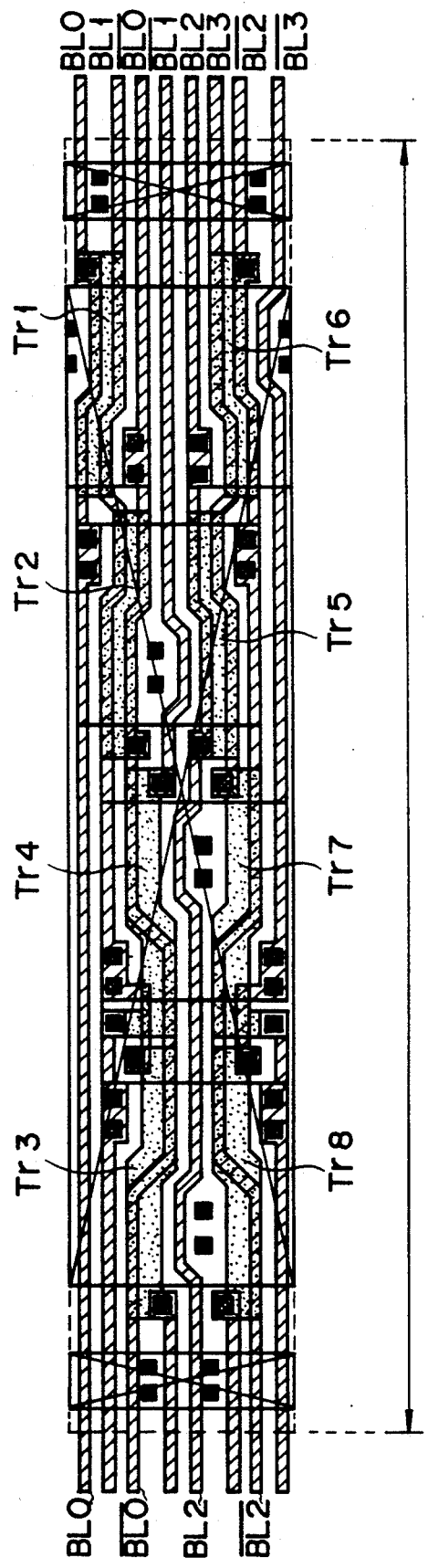
FIG. 33 is a plan view of the main part of the DRAM shown in FIG. 32, showing the layout of the actual wiring pattern of this DRAM.

The embodiment shown in FIG. 29 may be modified as is shown in FIG. 32. The modified twisted bit-line structure has the wiring pattern illustrated in FIG. 33. In the bit-line structure shown in FIG. 29, of the four MOS transistors Tr1 to Tr4 arranged in the direction in which the bit lines extend, the MOS transistors Tr1 and Tr2 constitute two sense amplifiers, and the MOS transistors Tr3 and Tr4 are combined, forming another sense amplifier. By contrast, in the bit-line structure shown in FIG. 32, of the MOS transistors Tr1 to Tr4, the MOS transistors Tr1 and Tr2 are combined, forming one sense amplifier, whereas the MOS transistors Tr3 and Tr4 are combined, forming another sense amplifier. The bit-line structure of FIG. 32 attains the same advantages as the embodiment shown in FIG. 29.

FIG. 34 illustrates another embodiment of this invention, which has an advanced twisted bit line structure wherein every three adjacent bit-line pairs, i.e., the first pair of bit lines BLi and $\overline{BLi}$, the second pair of bit line BL(i+1) and $\overline{BL(i+1)}$, and the third pair of bit lines BL(i+2) and $\overline{BL(i+2)}$, are associated together. The bit lines BL(i+1) and $\overline{BL(i+1)}$ of the second (intermediate) pair contain therebetween two lines, that are selected respectively from the other two bit line pairs, i.e., the first pair of bit lines BLi and $\overline{BLi}$ and the third pair of bit lines BL(i+2) and $\overline{BL(i+)}$. Furthermore, at least two bit line pairs of these three neighboring bit line pairs have twisted crossing structures. When one of these twisted bit line pairs is twisted at the middle position thereof, the remaining bit line is twisted at a couple of positions. The twisted crossing sections of these twisted bit line pairs are shifted so that they do not aligned together along the extending direction of the word lines WL. Memory cells M are connected on each word line WL, at every other intersections of the line WL and the bit lines, and are located in staggered fashion with respect to the memory cells M connected on either adjacent word line WL, thereby to ensure a sufficient gap between the memory-cell diffusion layers even if the DRAM has a high integration density.

Considering about three pairs of neighboring bit lines BL0, $\overline{BL0}$, BL1, $\overline{BL1}$, BL2, $\overline{BL2}$ in FIG. 34, the second, intermediate bit line pair BL1, $\overline{BL1}$ is not twisted. One of the bit lines BL0 and $\overline{BL0}$ of the first pair and one of the bit lines BL2 and $\overline{BL2}$ of the third pair are arranged so as to extend in between the bit lines BL1 and $\overline{BL1}$ of the second pair, before these pairs are twisted. The first bit-line pair BL0, $\overline{BL0}$ is then twisted at the middle portion thereof, $(\frac{1}{2})L$; the third bit-line pair BL2, $\overline{BL2}$ is twisted at two positions, i.e., positions $(\frac{1}{4})L$ and $(\frac{3}{4})L$, where L is the length of any bit line of the twisted bit-line structure. The twisted crossing section of the first pair BL0, $\overline{BL0}$ does not overlap those of the third pair BL2, $\overline{BL2}$ in the direction in which the word lines WL extend. In other words, the twisted crossing sections of the first and second bit-line pairs are set apart at intervals substantially equal in the direction in which the bit lines extend. The sense amplifiers are arranged as is illustrated in FIG. 34. More specifically, one set of amplifiers are connected to the left ends of some of the bit-line pairs and arranged in a line parallel to the word lines WL, and another set of amplifiers are connected to the right ends of the remaining bit-line pairs and arranged in a line also parallel to the word lines WL. Further, the sense amplifiers SA0, SA2 and SA3 of the first are staggered with respect to the sense amplifiers SA1, SA3 and SA5 of the second set.

The embodiment shown in FIG. 34 is advantageous over any embodiment described above in that interference noise among the bit lines can, in theory, be completely suppressed. The noise-suppressing effect of the twisted bit-line structure illustrated in FIG. 34 will be now analyzed with reference to FIG. 35 which is a table showing the distribution of the coupling capacitances among the bit lines.

Now let us consider about "external" interference noise that is applied to the bit line pair BLi, $\overline{BLi}$ from the neighboring bit line pairs adjacent thereto. In this case, the coupling capacitance between the bit lines of any pair is $(\frac{1}{4})C1$ as is evident from FIG. 35, where C1 is the coupling capacitance which would exits between any two adjacent bit lines if these bit lines extended parallel to each other, not twisted. When the bit line pairs are twisted as illustrated in FIG. 34, the coupling capacitances between each bit line pair and the bit line pairs neighboring thereto may be represented by $(\frac{1}{4})C1$ as is evident from FIG. 35.

It should be noted in FIG. 35 that the values of the coupling capacitances between the bit lines BL2 and $\overline{BL2}$ of the third pair, on the one hand, and the bit lines BL1 and $\overline{BL1}$ of the first pair actually include coupling capacitances between the bit lines and the fourth pair of bit lines BL3 and $\overline{BL3}$ that are equivalent to the bit lines BL0 and $\overline{BL0}$ for the following reason. In FIG. 34, the subsequent set of three adjacent bit line pairs (BL3, $\overline{BL3}$, BL4, $\overline{BL4}$, BL5, $\overline{BL5}$) that follow the first set of three adjacent bit line pairs (BL0, $\overline{BL0}$, BL1, $\overline{BL1}$, BL2, $\overline{BL2}$) are twist-arranged in the same way as those of the first set of three bit line pairs; and the coupling capacitances of the bit line pairs BL0, $\overline{BL0}$, BL3, $\overline{BL3}$ with respect to any of the other bit lines are same with one another. The same hold true of the coupling capacitances among the bit lines of any other three pairs (not shown) which are associated with one another.

As can be understood from the above description, the embodiment shown in FIG. 34, the bit lines of any pair of each set receive interference noise at the same degree from the adjacent bit lines of the other sets, so that applied interference noise, if any, will not cause voltage variation on the bit lines. Therefore, in theory, no interference noise exists between the bit lines of any pair of each set.

Figure 37:
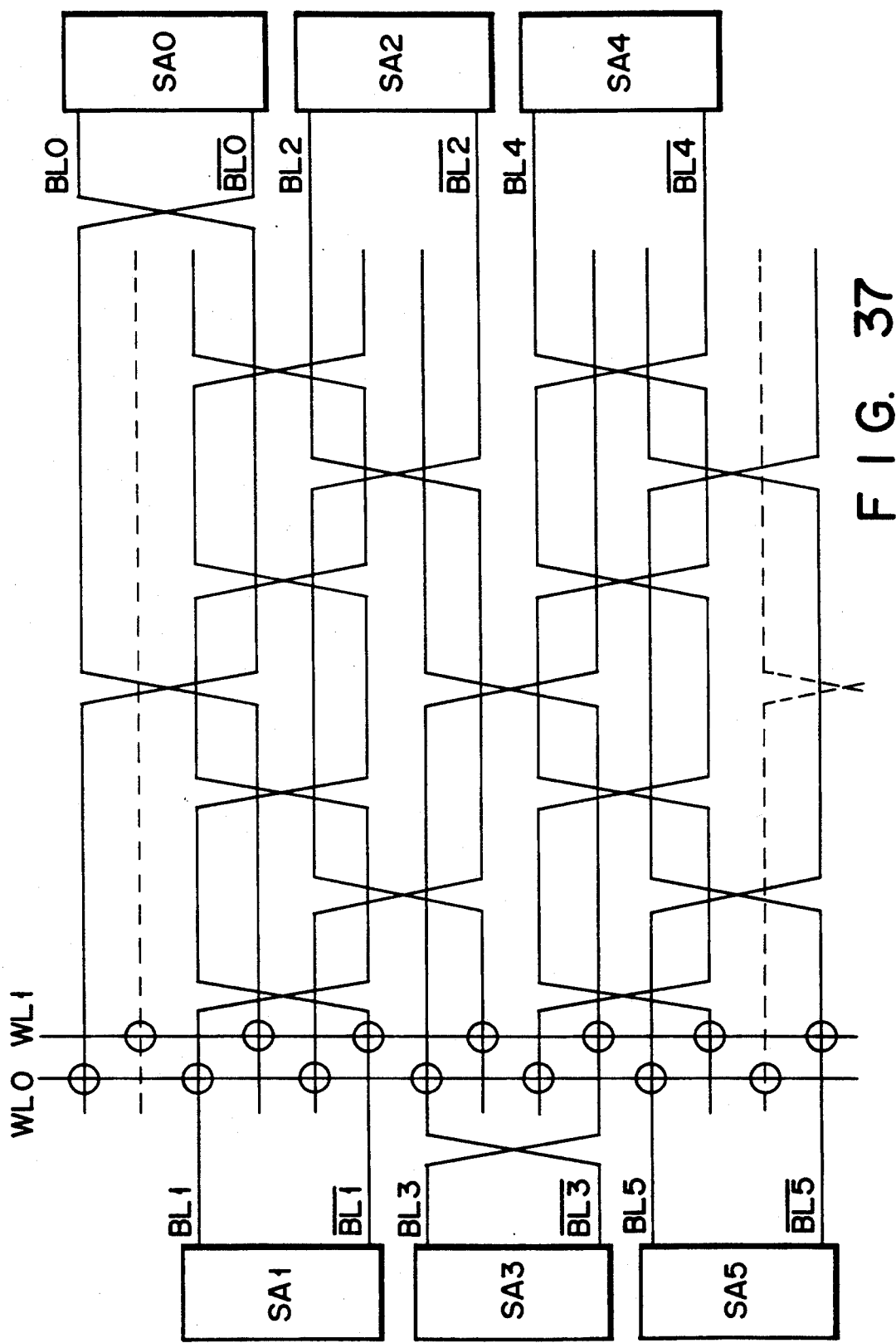
FIG. 37 is a diagram representing another modification of the twisted bit-line structure of the DRAM illustrated in FIG. 34.

The "three-phase" twisted bit-line structure shown in FIG. 34 may be modified in two ways, as is illustrated in FIG. 36 and FIG. 37. These modifications are identical to the embodiment shown in FIG. 34 in that every three adjacent bit-line pairs are associated with each other. They are, however, different in that the three bit-line pairs are twisted in specific ways. In the modification shown in FIG. 36, the bit lines of any pair are twisted. More specifically, the first bit-line pair (i.e., lines BL0 and $\overline{BL0}$) is twisted at the middle portion, $(\frac{1}{2})L$, where L is the length of either bit line; the second bit-line pair (i.e., bit lines BL1 and $\overline{BL1}$) is twisted at two positions $(\frac{1}{4})L$ and $(\frac{3}{4})L$; and the third bit-line pair (i.e., bit lines BL2 and $\overline{BL2}$) is twisted at four positions $(\frac{1}{8})L$, $(\frac{3}{8})L$, $(\frac{5}{8})L$, and $(\frac{7}{8})L$. In the modification illustrated in FIG. 37, the first bit-line pair (i.e., bit lines BL0 and $\overline{BL0}$) is twisted at two positions; the second bit-line pair (i.e. bit lines BL1 and $\overline{BL1}$) is twisted at four positions $(\frac{1}{8})L$, $(\frac{3}{8})L$, $(\frac{5}{8})L$, and $(\frac{7}{8})L$; and the third bit-line pair (i.e., bit lines BL2 and $\overline{BL2}$) is twisted at two positions $(\frac{1}{4})L$ and $(\frac{3}{4})L$.

In the embodiment of FIG. 34, and the modifications of FIGS. 36 and 37, substantially no interference noise is generated between the bit lines of any pair or applied to the bit lines of any pair from those of the other pairs. In addition, the memory cells M on each word line WL are located at every other intersections of the word line WLi and the bit lines BLi, and arranged in staggered fashion with respect to the memory cell M connected on either adjacent word line WL(i+1) or WL(i−1), thus set apart therefrom by a sufficient distance. In other words, the memory cells M on any two neighboring word lines WL are arranged in a zig-zag line, as is shown in FIGS. 34, 36, and 37. The elimination of interference noise and the specific arrangement of the memory cells M makes it quite possible to provide high-reliability, high-integration DRAMs.

FIG. 38 shows a modification of the embodiment, wherein twisted bit line pairs BL1, $\overline{BL1}$, BL3, $\overline{BL3}$ are twisted also at connection sections with the corresponding sense amplifiers SA1, SA3 in a similar manner as in FIGS. 9 to 11.

What is claimed is:

1. A dynamic semiconductor memory device comprising:
    bit line pairs;
    word lines insulatively intersecting said bit lines;
    memory cells provided at selected ones of intersecting points between said bit lines and said word lines;
    sense amplifiers provide for said bit line pairs and having transistors; and
    at least one of two neighboring bit line pairs of said bit line pairs being twisted at at least one position thereof to have a twisted crossing section which is formed using gate electrodes of said transistors included in a sense amplifier of said at least one bit line pair.

2. The device according to claim 1, wherein said at least one bit line pair is twisted at a substantially center position along a longitudinal direction thereof, in which said sense amplifier is provided.

3. The device according to claim 1, wherein said at least one bit line pair is twisted at a substantially center position along a longitudinal direction thereof, and is located between two bit lines of the other bit line pair of said two neighboring bit line pair.

4. The device according to claim 1, wherein said at least one bit line pair is twisted at a substantially center position along a longitudinal direction thereof, and wherein the other bit line pair of said two neighboring bit line pair is located between two bit lines of said at least one bit line pair.

5. The device according to claim 1, wherein one of said two neighboring bit line pairs has one of two bit lines of the other of said two neighboring bit line pairs located therebetween, and wherein the other bit line pair is twisted at a substantially center position along a longitudinal direction thereof.

6. A dynamic random access memory comprising:
    folded type parallel bit line pairs;
    word lines insulatively intersecting said bit lines;
    memory cells provided at selected ones of intersecting points between said bit lines and said word lines;
    sense amplifiers provided for said bit line pairs and having transistors; and
    every two neighboring bit line pairs of said bit line pairs having a twisted bit line pair which is twisted at a single selected position in a substantially central region along the longitudinal direction thereof to provide a twisted crossing section, and a straight bit line pair having two straight bit lines, one pair of said twisted bit line pair and said straight bit line pair being located between two bit lines of the other pair thereof.

7. A dynamic random access memory comprising:
    folded type parallel bit line pairs;
    word lines insulatively intersecting said bit line pairs;
    memory cells provided at selected ones of intersecting points between said bit lines and said word lines;
    sense amplifiers provided for said bit line pairs and having transistors; and
    every two neighboring bit line pairs of said bit line pairs having a twisted bit line pair which is twisted at a selected position in a middle region along the longitudinal direction thereof to provide a twisted crossing section;
    wherein said sense amplifiers include a certain sense amplifier circuit for said twisted bit line pair, said certain sense amplifier circuit having metal-oxide-semiconductor field effect transistors some of which are used as at least one part of a contact region for forming said twisted crossing section.

8. The memory according to claim 6, wherein said twisted bit line pair has two bit lines which surround a bit line pair neighboring thereto.

9. The memory according to claim 6, wherein said twisted bit line pair is surrounded by two bit lines of a bit line pair neighboring to said twisted bit line pair.

10. The memory according to claim 6, wherein said twisted bit line pair surrounds one of two bit lines of a bit line pair neighboring to said twisted bit line pair.

11. A dynamic random access memory comprising:
    folded type parallel bit line pairs;
    word lines insulatively intersecting said bit line pairs;
    memory cells provided at selected ones of intersecting points between said bit lines and said word lines; and
    sense amplifiers provided for said bit line pairs and having transistors;

every set of three neighboring bit line pairs of said bit line pairs overlapping one another in such a manner that each bit line pair of said three neighboring bit line pairs has two bit lines located therebetween respectively selected from the remaining two bit line pairs of said three neighboring bit line pairs.

12. The device according to claim 11, wherein said memory cells comprise:
a first array of memory cells, associated with a first word line, located at alternating ones of intersecting points defined between said first word line and the bit lines of said every three neighboring bit line pairs; and
a second array of memory cells, associated with a second word line disposed adjacent to said first word line, located at alternating ones of intersecting points defined between said second word line and the bit lines of said every three neighboring bit line pairs, said first and second array of memory cells being staggered such that memory cells are located at alternating intersecting points of said word lines with each bit line.

13. The memory according to claim 12, wherein said bit line pairs include a set of three neighboring bit line pairs which include at least two twisted bit line pairs one of which is twisted at a substantially central position along a longitudinal direction thereof to provide a twisted crossing section.

14. The memory according to claim 13, wherein the other of said two twisted bit line pairs is twisted at selected positions along the longitudinal direction thereof which are different from said central position, thereby to provide a plurality of twisted crossing sections.

15. A dynamic random access memory comprising:
folded type parallel bit line pairs;
word lines insulatively crossing said bit lines, said word line including a first word line and a second word line adjacent to said first word line;
memory cells provided at selected ones of intersecting points between said bit lines and said word lines;
sense amplifiers provided for said bit line pairs and having transistors; and
two neighboring bit line pairs of said bit line pairs having a first pair of bit lines which is twisted at a single selected position thereof to have a twisted crossing section, and a second pair of bit lines which are straight lines and one of which is located between said first pair of bit lines, said first pair of bit lines being twisted at a substantially central position along the longitudinal direction thereof.

* * * * *